United States Patent
Hayashida et al.

(10) Patent No.: US 11,107,895 B2
(45) Date of Patent: Aug. 31, 2021

(54) SEMICONDUCTOR DEVICE

(71) Applicant: Mitsubishi Electric Corporation, Tokyo (JP)

(72) Inventors: Tetsuro Hayashida, Tokyo (JP); Takuma Nanjo, Tokyo (JP); Tatsuro Watahiki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/962,863

(22) PCT Filed: Feb. 23, 2018

(86) PCT No.: PCT/JP2018/006630
§ 371 (c)(1),
(2) Date: Jul. 17, 2020

(87) PCT Pub. No.: WO2019/163075
PCT Pub. Date: Aug. 29, 2019

(65) Prior Publication Data
US 2020/0381519 A1 Dec. 3, 2020

(51) Int. Cl.
*H01L 29/22* (2006.01)
*H01L 29/201* (2006.01)

(52) U.S. Cl.
CPC .......... *H01L 29/22* (2013.01); *H01L 29/201* (2013.01)

(58) Field of Classification Search
CPC ... H01L 29/22; H01L 29/201; H01L 29/1033; H01L 29/66734; H01L 29/41766; H01L 29/7809; H01L 29/7813; H01L 29/7811; H01L 29/205; H01L 29/2003; H01L 29/78
See application file for complete search history.

(56) References Cited

U.S. PATENT DOCUMENTS

| 10,050,137 B2 * | 8/2018 | Morvan ................ H01L 29/205 |
| 2004/0157355 A1 | 8/2004 | Kachi et al. |
| 2020/0295173 A1 * | 9/2020 | Escoffier ............. H01L 29/7786 |

FOREIGN PATENT DOCUMENTS

| JP | 2004-260140 A | 9/2004 |
| JP | 2008-135575 A | 6/2008 |
| JP | 2017-063174 A | 3/2017 |

OTHER PUBLICATIONS

International Search Report and Written Opinion dated Mar. 27, 2018 for PCT/JP2018/006630 filed on Feb. 23, 2018, 9 pages including English Translation of the International Search Report.

* cited by examiner

*Primary Examiner* — Syed I Gheyas
(74) *Attorney, Agent, or Firm* — Xsensus LLP

(57) ABSTRACT

A semiconductor device includes a supporting substrate, a first GaN layer of a first conductivity type provided on the side of a first main surface of the supporting substrate, a second GaN layer of the first conductivity type provided on the first GaN layer, an AlxGa1-xN layer provided on the second GaN layer, a third GaN layer of a second conductivity type provided on the AlxGa1-xN layer, a fourth GaN layer of the first conductivity type provided on the third GaN layer, an insulating film covering a top of the fourth GaN layer, a trench gate reaching the inside of the second GaN layer, a gate electrode, a first main electrode connected to the third GaN layer, and a second main electrode, and the donor concentration of the third GaN layer is lower than that of the fourth GaN layer.

19 Claims, 19 Drawing Sheets

F I G. 1
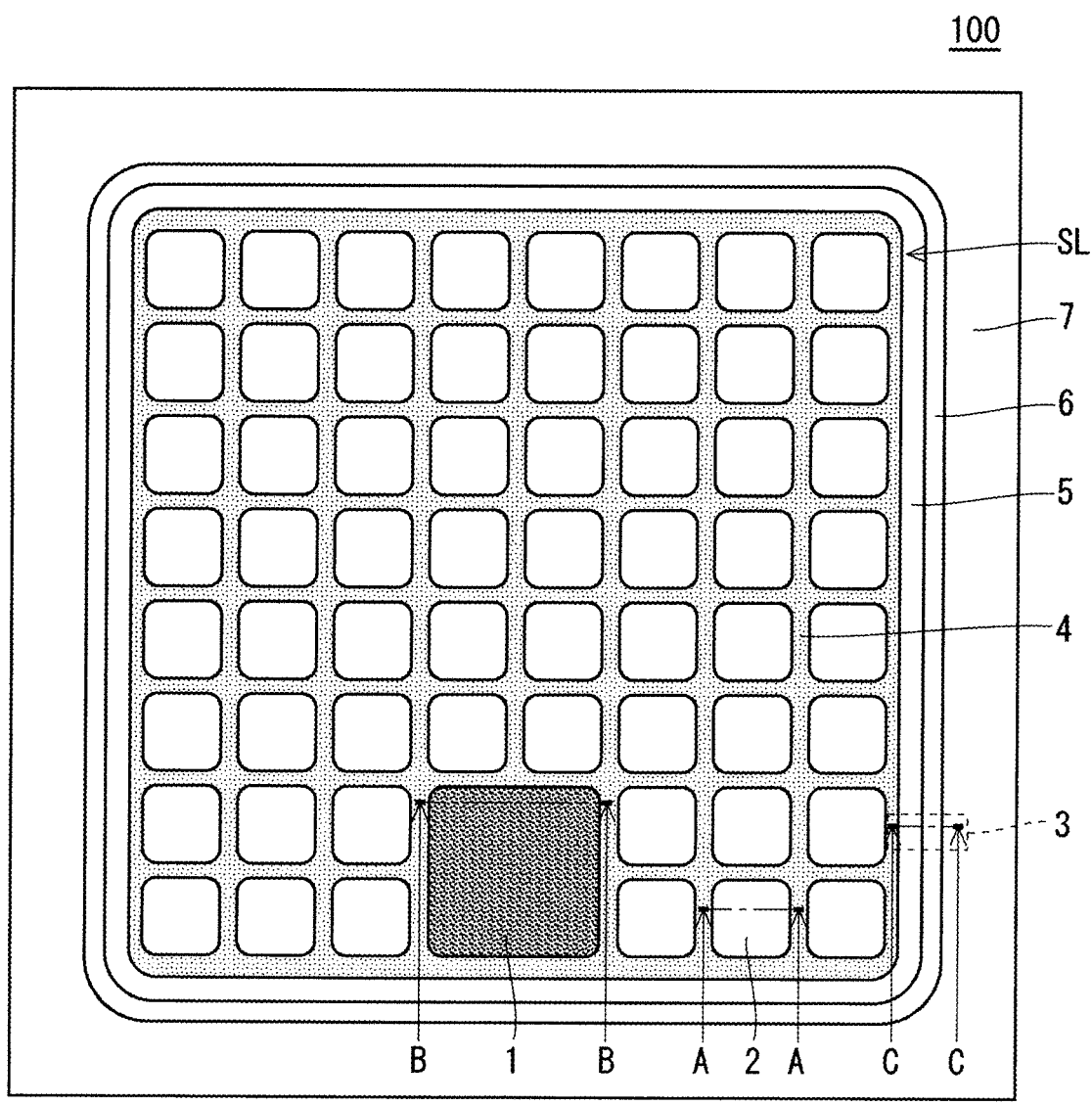

F I G. 5
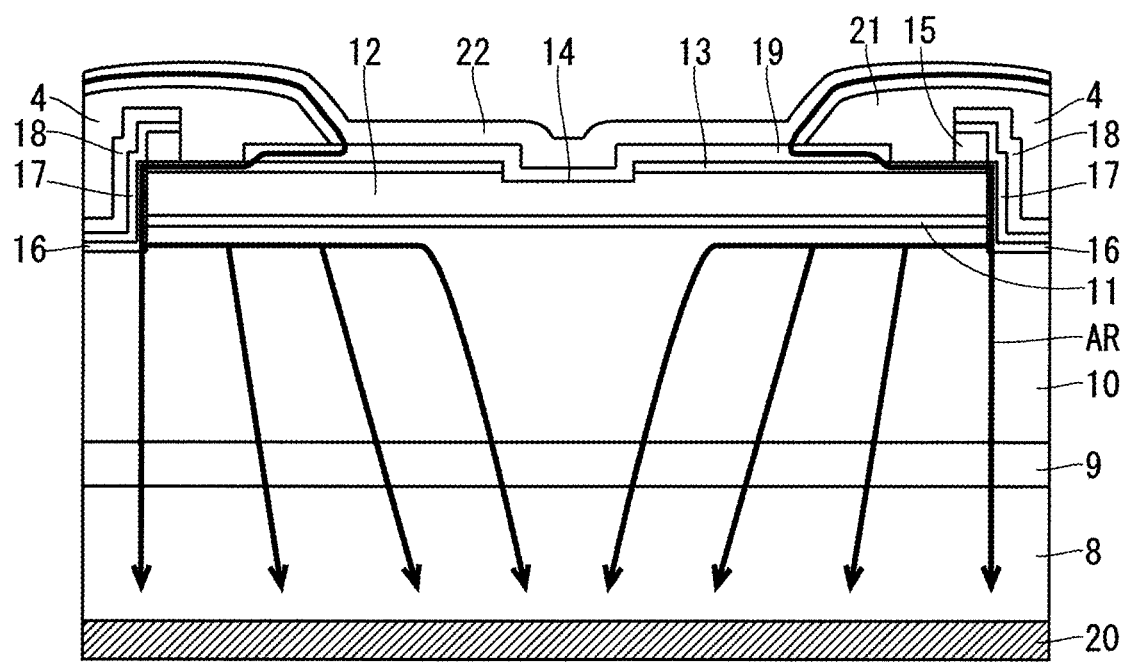

SEMICONDUCTOR DEVICE

CROSS-REFERENCE TO RELATED APPLICATIONS

The present application is based on PCT filing PCT/JP2018/006630, filed Feb. 23, 2018, the entire contents of which are incorporated herein by reference.

TECHNICAL FIELD

The present invention relates to a semiconductor device, and more particularly to a semiconductor device in which an ON resistance can be reduced and a breakdown voltage can be ensured.

BACKGROUND ART

In recent years, development of wide bandgap semiconductor devices using wide gap semiconductors have been active, in which the thickness of a drift layer which ensures a breakdown voltage can be reduced and reduction in the On voltage can be achieved, and particularly, propositions on a vertical MOS Field Effect Transistor (trench MOSFET) having a trench gate, which is formed on a GaN (gallium nitride) substrate, have increased.

The vertical trench MOSFET generally has a problem that electric field concentration easily occurs on a bottom portion of the trench gate. In order to increase a dielectric breakdown voltage, it is indispensable to reduce the electric field concentration on that portion. An exemplary structure for reducing the electric field concentration is a structure in which a p-type impurity layer is disposed in the vicinity of the trench gate. Since a depletion layer is thereby spread from a pn junction interface, it is possible to reduces the electric field concentration at an end portion of the trench gate and increase the breakdown voltage of the semiconductor device.

On the other hand, since the p-type impurity layer disposed in the vicinity of the trench gate inhibits spreading of an electron flow after passing a channel region, the p-type impurity layer is a factor for an increase in the ON resistance. This resistance element is termed as a JFET (Junction Field Effect Transistor) resistance, and as the semiconductor device is miniaturized, the proportion of this resistance element in the factor for the increase in the ON resistance increases. For this reason, in order to achieve both an increase in the breakdown voltage and reduction in the ON resistance in the semiconductor device, it is indispensable to take measures against this JFET resistance.

In Patent Document 1, for example, in order to reduce an effect of the JFET resistance, an n-type impurity layer is disposed below a p-type body region. A high-concentration n-type impurity layer disposed below the channel region is generally termed as a current spreading layer (CSL). In Patent Document 1, by providing the current spreading layer, the conductivity in a transverse direction at an upper end of the drift layer is increased and the effect of the JFET resistance is thereby reduced. Further, in Patent Document 1, as a measure against an increase in the electric field strength of the pn junction interface, a low-concentration n-type impurity layer is disposed in an interface between the current spreading layer and the p-type body region. The increase in the electric field strength of the pn junction interface is thereby suppressed.

On the other hand, in Patent Document 2, a side surface and a bottom surface of the trench gate is covered with a two-layer structure formed of an AlGaN layer and a GaN layer (AlGaN/GaN structure). By adopting such a structure, a two-dimensional electron gas (2DEG) is generated in the GaN layer at an AlGaN interface. It is thereby possible to promote the spreading of the electron flow in a lower portion of the trench.

Further, in a power MOSFET, it is very important to ensure avalanche capability (avalanche resistance). In order to prevent avalanche breakdown, it is necessary to draw holes from a source electrode through a $p^+$ impurity layer which includes relatively high amount of p-type impurities so that the potential of the p-type body region should not increase.

In Patent Document 3, a p-type InGaN layer is disposed inside an n-type drift layer below the trench gate. A two-dimensional hole gas (2DHG) is thereby induced in a lower layer interface between the p-type InGaN layer and the n-type GaN layer and movement of holes is promoted. Further, by connecting a conductive electrode to a 2DHG region in which the 2DHG is induced, it becomes possible to draw the holes and increase the avalanche capability.

PRIOR ART DOCUMENTS

Patent Documents

[Patent Document 1] Japanese Patent Application Laid Open Gazette No. 2017-63174
[Patent Document 2] Japanese Patent Application Laid Open Gazette No. 2004-260140
[Patent Document 3] Japanese Patent Application Laid Open Gazette No. 2008-135575

SUMMARY

Problem to be Solved by the Invention

In the structure disclosed in Patent Document 1, when variation in a depth direction in processing of the trench gate is taken into consideration, it is necessary to make such a design that the thickness of the low-concentration n-type impurity layer should be large. Since a distance between the end portion of the trench gate and the high-concentration n-type impurity layer (CSL) becomes large, there arises a problem that the effect of the current spreading layer is reduced. Further, since the n-type impurity layer whose concentration is higher than that of the drift layer is provided in the pn junction interface, this causes problems that an increase in the electric field strength of the pn junction interface cannot be avoided and that the breakdown voltage is easily reduced.

As to Patent Document 2, while an effect of spreading the electron flow in the lower portion of the trench gate is expected with the AlGaN/GaN structure in the lower portion of the trench gate, it is impossible to spread the electron flow below a source region which occupies a large proportion of the device area since no AlGaN/GaN structure is formed below the source electrode. The trench gate is normally a so-called invalid region in which no current can be carried, except a side wall portion thereof, and therefore a trench region is designed to be as narrow as possible. For this reason, even if a current spreading layer is formed in the lower portion of the trench gate, the current spreading layer is not thought to be effective since the proportion of the area thereof which occupies in the semiconductor device is small.

As to Patent Document 3, in order to promote discharge of the holes, a p-type InGaN layer is disposed inside the drift layer in the lower portion of the trench gate. Since the InGaN layer has a bandgap narrower than that of the GaN layer, a quantum well is formed inside the drift layer. By drawing the holes from this quantum well, the avalanche capability is increased, but electrons are captured in the quantum well after passing the channel region and become easier to be recombined, and therefore reduction in the drain current cannot be avoided.

The present invention is intended to solve such problems as above, and it is an object of the present invention to provide a semiconductor device in which an ON resistance can be reduced, a breakdown voltage is ensured, and avalanche capability is increased.

Means to Solve the Problem

A semiconductor device in accordance with the present invention includes a supporting substrate, a first GaN layer of a first conductivity type provided on the side of a first main surface of the supporting substrate, a second GaN layer of the first conductivity type provided on the first GaN layer, an $Al_xGa_{1-x}N$ (0<x<1) layer provided on the second GaN layer, a third GaN layer of a second conductivity type provided on the $Al_xGa_{1-x}N$ (0<x<1) layer, a fourth GaN layer of the first conductivity type provided on the third GaN layer, an insulating film covering at least a top of the fourth GaN layer, a trench gate reaching the inside of the second GaN layer from an upper surface of the fourth GaN layer, a gate electrode provided in the trench gate with a gate insulating film interposed therebetween, a first main electrode connected to the third GaN layer, and a second main electrode paired with the first main electrode, and the donor concentration of the third GaN layer is lower than that of the fourth GaN layer.

Effects of the Invention

According to the above-described semiconductor device, with a polarization effect of GaN/AlGaN/GaN, the two-dimensional electron gas is induced inside the second GaN layer and the two-dimensional hole gas is induced inside the third GaN layer. By using the two-dimensional electron gas as the current spreading layer, the conductivity in a horizontal direction in an upper layer portion of the second GaN layer is remarkably increased, and it is therefore possible to promote the spreading of the electron flow and reduce the ON resistance. Further, since the two-dimensional electron gas is induced inside the third GaN layer, it is possible to increase the avalanche capability. Since the two-dimensional electron gas is used as the current spreading layer, additional doping for formation of the current spreading layer is not needed and it is therefore possible to ensure a breakdown voltage.

BRIEF DESCRIPTION OF DRAWINGS

FIG. 1 is a plan view showing an upper surface structure of a semiconductor device of a first preferred embodiment in accordance with the present invention;

FIG. 5 is a view schematically showing a path of a main current in the source unit cell of the semiconductor device of the first preferred embodiment in accordance with the present invention;

FIG. 22 is a view showing a positional relation between a growth interface of an epitaxial growth layer and a channel interface;

FIG. 23 is a cross section showing a method of manufacturing the semiconductor device of the second preferred embodiment in accordance with the present invention;

DESCRIPTION OF EMBODIMENT(S)

Figure 2:
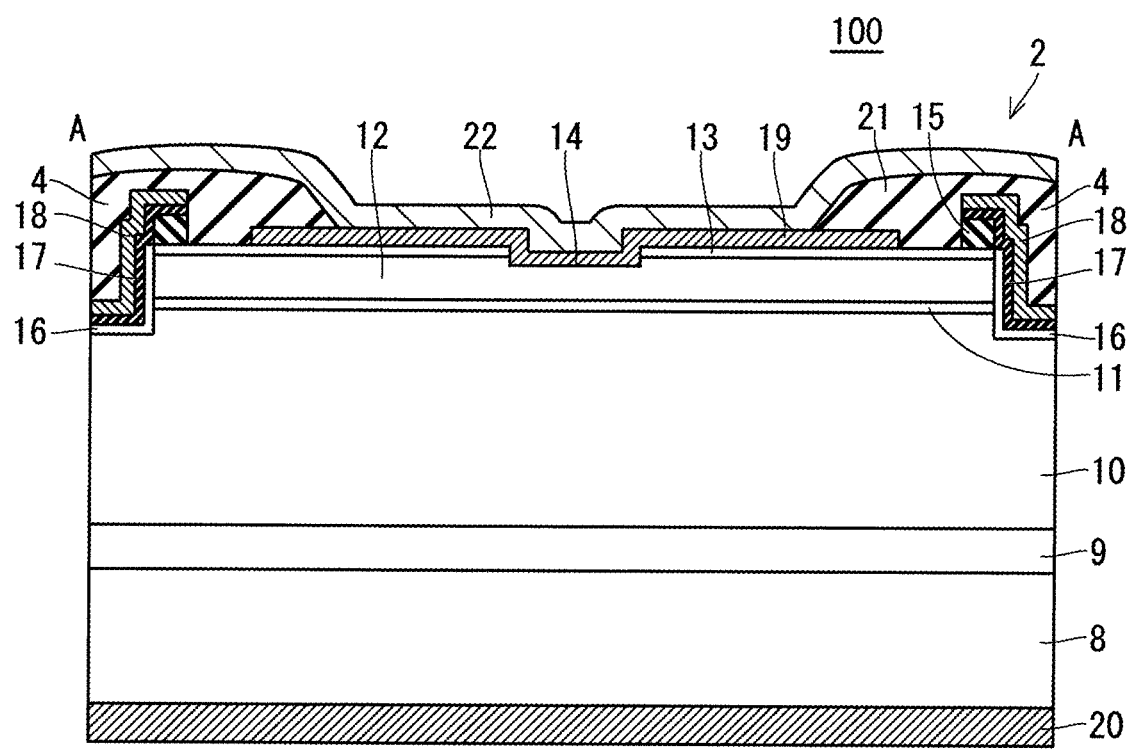
FIG. 2 is a cross section showing a source unit cell of the semiconductor device of the first preferred embodiment in accordance with the present invention.

Hereinafter, with reference to attached figures, the preferred embodiments of a semiconductor device and a method of manufacturing the same in accordance with the present invention will be described in detail. Further, the present invention is not limited to these preferred embodiments, and may be changed as appropriate, without departing from the scope of the invention. Furthermore, in the following figures, for easy understanding, constituent members or scales of the constituent members are sometimes different from actual ones, and the same applies among the figures. In the following description, as to the conductivity of an impurity, it is generally defined that n type is "a first conductivity type" and p type is "a second conductivity type", but the reverse definition may be adopted.

The First Preferred Embodiment

Device Structure

FIG. 1 is a plan view showing a structure of a vertical trench MOSFET 100 of the first preferred embodiment in accordance with the present invention and is a top view showing the vertical trench MOSFET 100 viewed from above. For easy understanding of this figure, a pad electrode which covers and hides the structure is omitted in the top view. Further, since the object is to grasp an overview of a semiconductor device, details of the structure are not shown.

As shown in FIG. 1, in the vertical trench MOSFET 100, a plurality of trench gates 4 intersect longitudinally and transversely at regular intervals, one region surrounded by the trench gates forms a source unit cell 2 which is a minimum unit structure of a MOSFET, a plurality of source unit cells 2 are arranged in a matrix, to thereby form a cell array area SL. A plan view shape of the cell array area SL is a quadrangle in which a center portion of one side is dented inwardly, a gate cell 1 is so provided as to be placed in the inwardly dent portion in the cell array area SL, and all the trench gates 4 are electrically connected to the gate cell 1.

Further, though described later with reference to figures, the vertical trench MOSFET 100 has a mesa structure, the cell array area SL is provided on a flat upper surface portion 5 of the mesa structure, an inclined side surface portion 6 surrounds the upper surface portion 5, and a flat bottom surface portion 7 is present outside the side surface portion 6. Furthermore, since a plurality of vertical trench MOSFETs 100, one of which is shown in FIG. 1, are formed on a supporting substrate in a state of wafer and individually divided into discrete semiconductor chips in the final step, hereinafter, the vertical trench MOSFET 100 will be sometimes referred to as a chip.

Figure 3:
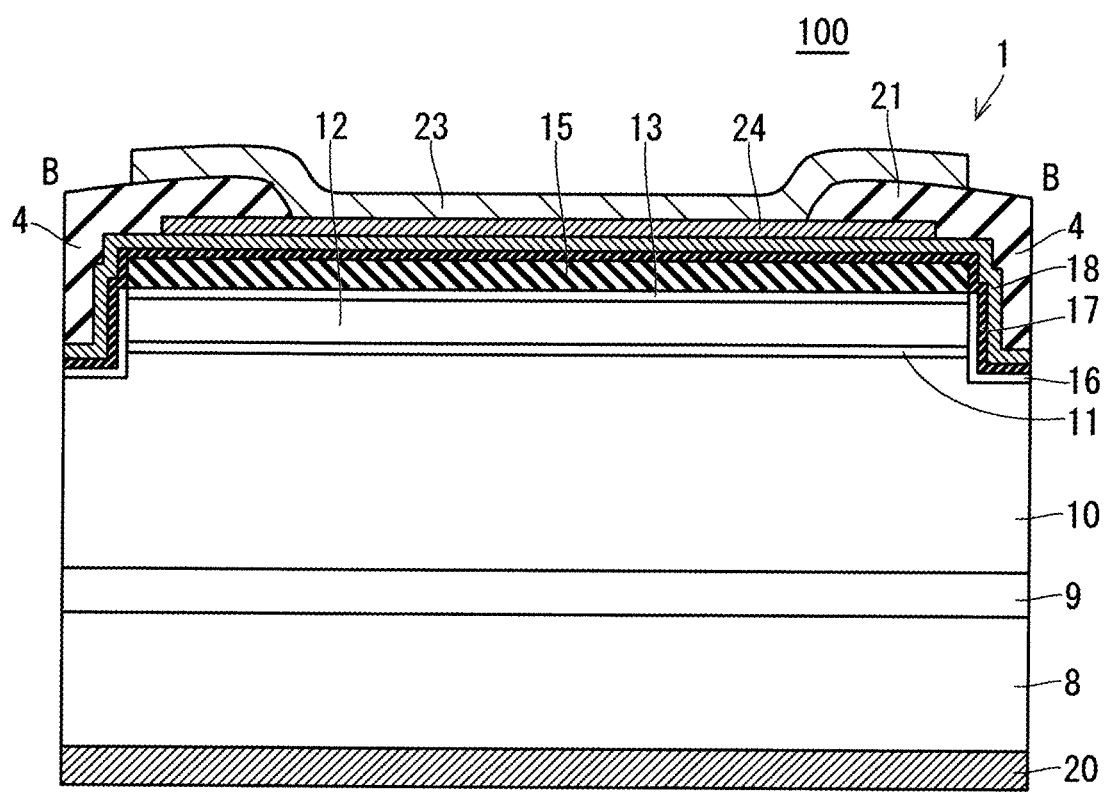
FIG. 3 is a cross section showing a gate cell of the semiconductor device of the first preferred embodiment in accordance with the present invention.
Figure 4:
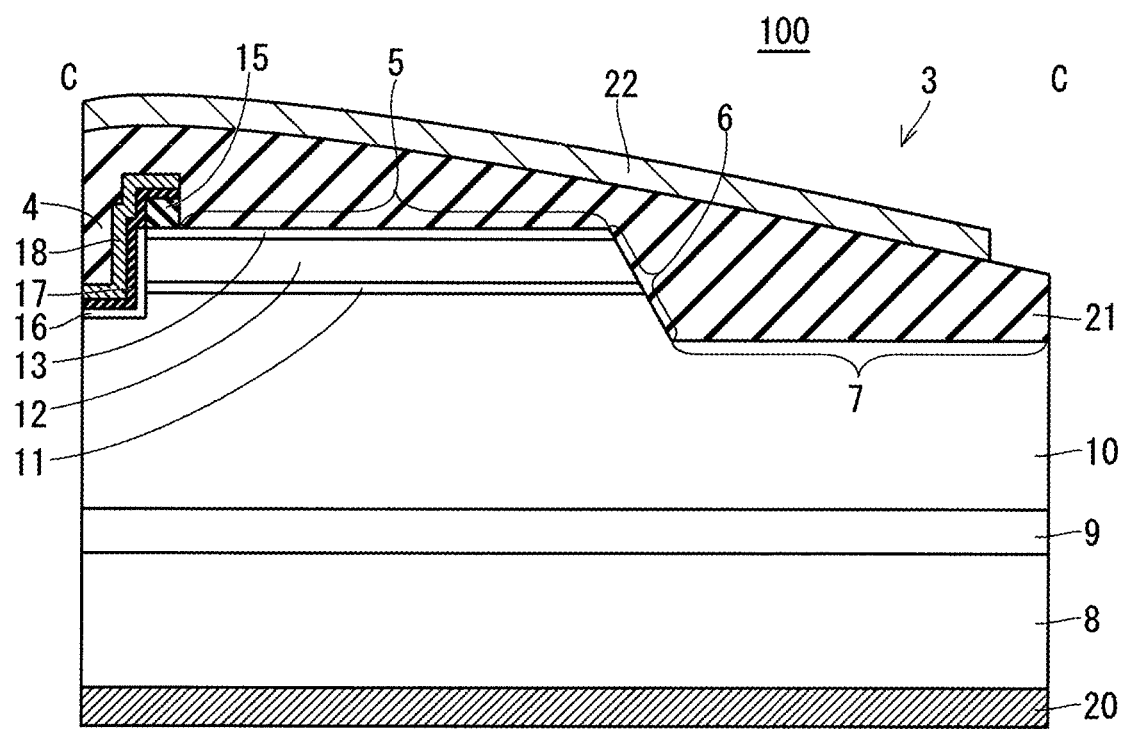
FIG. 4 is a cross section showing a termination cell of the semiconductor device of the first preferred embodiment in accordance with the present invention.

FIG. 2 is a cross section showing the source unit cell of the vertical trench MOSFET 100 and corresponds to an arrow cross section taken along the line A-A of FIG. 1. FIG. 3 is a cross section showing the gate cell and corresponds to an arrow cross section taken along the line B-B in the gate cell 1 of FIG. 1. FIG. 4 is a cross section showing a termination cell and corresponds to an arrow cross section taken along the line C-C in a termination cell 3 of FIG. 3.

As shown in FIG. 2, the vertical trench MOSFET 100 is formed on an n-type GaN substrate 8 whose main surface is a (0001) plane (c-plane), and on a first main surface of the GaN substrate 8, layered are a GaN layer 9 (first GaN layer), a GaN layer 10 (second GaN layer), an $Al_xGa_{1-x}N$ layer 11 (AlGaN layer), a GaN layer 12 (third GaN layer), and a GaN layer 13 (fourth GaN layer).

Herein, the GaN layer 9 is doped with silicon (Si) at a concentration of about $5 \times 10^{17}$ to $5 \times 10^{18}$ cm$^{-3}$ and thereby has an n-type conductivity. The GaN layer 10 is doped with Si at a concentration of about $2 \times 10^{14}$ to $8 \times 10^{16}$ cm$^{-3}$ and thereby has an n-type conductivity. The $Al_xGa_{1-x}N$ layer 11 is not intentionally doped with any impurity which serves as a donor or an acceptor and thereby has an i-type conductivity. Further, the composition ratio x of Al in $Al_xGa_{1-x}N$ takes a value in a range of 0<x<1, and more preferably takes a value from 0.15 to 0.35.

The GaN layer 12 is doped with magnesium (Mg) as a p-type impurity at a concentration of about $1 \times 10^{15}$ to $1 \times 10^{19}$ cm$^{-3}$. The GaN layer 13 is doped with Si at a concentration of about $5 \times 10^{17}$ to $1 \times 10^{20}$ cm$^{-3}$ and thereby has an n-type conductivity.

As shown in FIG. 2, the source unit cell 2 is defined by the trench gates 4 each of which penetrates the GaN layer 13, the GaN layer 12, and the $Al_xGa_{1-x}N$ layer 11 in a thickness direction to reach the inside of the GaN layer 10, and an inner surface of the trench gate 4 is covered with a GaN layer 16 (fifth GaN layer). The GaN layer 16 is doped with Mg as a p-type impurity at a concentration of about $1 \times 10^{15}$ to $5 \times 10^{17}$ cm$^{-3}$. Since a channel layer is formed in the GaN layer 16, by setting the acceptor concentration of the GaN layer 16 lower than that of the GaN layer 12 which is to serve as a body region, it is possible to improve mobility.

A top of the GaN layer 16 is covered with a gate insulating film 17 and a top of the gate insulating film 17 is covered with a gate electrode 18. At an edge portion of the GaN layer 13 which corresponds to an edge portion of the source unit cell 2, provided is an insulating film 15 (first insulating film), and end portions of the gate insulating film 17 and the gate electrode 18 get onto the insulating film 15 and the end portion of the gate electrode 18 therefore extends above the GaN layer 13.

Between the gate electrode 18 and the GaN layer 13, provided are the insulating film 15 and the gate insulating film 17, and the gate electrode 18 and the GaN layer 13 are thereby electrically isolated from each other. Further, the gate electrode 18 has a termination portion above the GaN layer 13. Furthermore, the GaN layer 13 has, at a center portion thereof in a plane direction, a body contact 14 (contact portion) having an opening which penetrates the GaN layer 13 in the thickness direction to reach the inside of the GaN layer 12, and the GaN layer 12 is exposed in a bottom surface of the body contact 14. Then, a source electrode 19 (first main electrode) is in contact with the GaN layer 12 through the body contact 14. The source electrode 19 is so provided as to be in contact with both the GaN layer 12 and an upper surface of the GaN layer 13.

Since it becomes easier to come into contact with the GaN layer 12 by providing the body contact 14, a body potential is stabilized and a threshold voltage is stabilized with reduction in the variation thereof. Further, since it becomes easier to draw holes from the body region, avalanche capability is increased.

Furthermore, though an insulating film 21 (second insulating film) is so provided as to cover the source electrode 19, the GaN layer 13, and an upper portion of the trench gate 4, and the source electrode 19 and the gate electrode 18 are thereby electrically isolated from each other, the insulating film 21 has an opening above the source electrode 19 and the source electrode 19 is exposed in a bottom surface of the opening. Then, a source pad electrode 22 which is so provided as to cover the insulating film 21 is in contact with the source electrode 19 and applies a source potential to the source electrode 19. Further, a cross-sectional shape of the opening is inclined in a forward tapered shape.

Furthermore, on a second main surface opposite to the first main surface of the GaN substrate 8, provided is a drain electrode 20 (second main electrode), and when the vertical trench MOSFET 100 is on an operation, a main current flows from the source electrode 19 toward the drain electrode 20.

Like the source unit cell 2, the gate cell 1 shown in FIG. 3 is also defined by the trench gates 4 each of which penetrates the GaN layer 13, the GaN layer 12, and the $Al_xGa_{1-x}N$ layer 11 in the thickness direction to reach the inside of the GaN layer 10, and on an upper portion of the GaN layer 13, the insulating film 15, the gate insulating film 17, the gate electrode 18, and an etch stop electrode 24 are layered and the gate electrode 18 and the etch stop electrode 24 are electrically conducted to each other.

Further, though the insulating film 21 is so provided as to cover the etch stop electrode 24, the gate electrode 18, and the upper portion of the trench gate 4, the insulating film 21 has an opening above the etch stop electrode 24 and the etch stop electrode 24 is exposed in a bottom surface of the opening. Then, a gate pad electrode 23 which is so provided as to cover the insulating film 21 is in contact with the etch stop electrode 24 and applies a gate potential to the gate electrode 18 through the etch stop electrode 24.

As shown in FIG. 4, the termination cell 3 is provided outside the trench gates 4 in an outermost circumference of the cell array area SL and a region which corresponds to an outer peripheral portion of the mesa structure is generally referred to as the termination cell 3. As described earlier, the mesa structure has the upper surface portion 5 in which the cell array area SL is provided, the side surface portion 6 which is inclined and surrounds the upper surface portion 5, and the bottom surface portion 7 outside the side surface portion 6. Further, a region in which the side surface portion 6 and the bottom surface portion 7 of the mesa structure are provided corresponds to a chip termination portion.

The side surface portion 6 is inclined in a forward tapered shape, and in a sloped surface thereof, respective end surfaces of the GaN layer 13, the GaN layer 12, and the $Al_xGa_{1-x}N$ layer 11 are exposed, part of the GaN layer 10 is also exposed, and the bottom surface portion 7 is part of a main surface of the GaN layer 10. Further, the vertical position of the bottom surface portion 7 from the GaN substrate 8 is lower than the bottom surface of the trench gate 4. By adopting such a mesa structure, a inclined field plate structure is achieved and it is thereby possible to reduce the electric field concentration at the chip termination portion and increase the breakdown voltage.

The trench gate 4 is so provided as to penetrate the GaN layer 13, the GaN layer 12, and the $Al_xGa_{1-x}N$ layer 11 in the thickness direction and reach the inside of the GaN layer 10, and the inner surface of the trench gate 4 is covered with the GaN layer 16.

A top of the GaN layer 16 is covered with the gate insulating film 17, and a top of the gate insulating film 17 is covered with the gate electrode 18. Further, at the edge portion of the GaN layer 13 which corresponds to an innermost circumference of the termination cell 3, provided is the insulating film 15, and the end portions of the gate insulating film 17 and the gate electrode 18 get onto the insulating film 15 and the end portion of the gate electrode 18 therefore extends above the GaN layer 13. This portion is the termination portion of the gate electrode 18.

The bottom surface portion 7, the side surface portion 6, and the upper surface portion 5 are covered with the insulating film 21, and the source pad electrode 22 is provided on the insulating film 21. The source pad electrode 22 is inclined on the insulating film 21 toward the bottom surface portion 7 of the mesa structure and has a termination portion on the bottom surface portion 7. Further, the source pad electrode 22 at the chip termination portion serves also as a field plate electrode, which contributes to reduction of the electric field concentration at the chip termination portion and increases the breakdown voltage.

FIG. 5 is a view schematically showing a path of a main current in the source unit cell 2 of the vertical trench MOSFET 100, and the main current is represented by an arrow AR.

As shown in FIG. 5, the main current flowing from the source pad electrode 22 includes a current carried in a path which goes, via the source electrode 19, through the GaN layer 13, the GaN layer 16 on a side surface of the GaN layer 12, and the GaN layer 10 in the thickness direction to reach the drain electrode 20 and another current carried in another path which spreads in the GaN layer 10 along the $Al_xGa_{1-x}N$ layer 11 in the horizontal direction and goes through the GaN layer 10 in a diagonal direction to reach the drain electrode 20. Such spreading of the main current in the GaN layer 10 in the horizontal direction along the $Al_xGa_{1-x}N$ layer 11 is an effect of using a two-dimensional electron gas (2DEG) induced in the GaN layer 10 in the vicinity of an interface of the $Al_xGa_{1-x}N$ layer 11, as a current spreading layer (CSL).

Manufacturing Method

Figure 6:
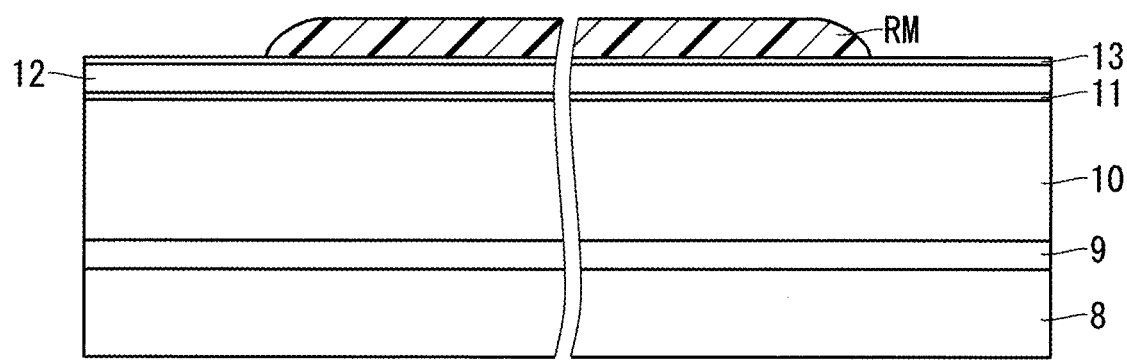
FIG. 6 is a cross section showing a method of manufacturing the semiconductor device of the first preferred embodiment in accordance with the present invention.

With reference to FIGS. 6 to 18, a method of manufacturing the vertical trench MOSFET 100 of the first preferred embodiment in accordance with the present invention will be described. First, in a process step of FIG. 6, as the supporting substrate, the GaN substrate 8 of the n-type conductivity, whose main surface is a (0001) plane (c-plane), is prepared, and after cleaning the substrate, the GaN layer 9, the GaN layer 10, the $Al_xGa_{1-x}N$ layer 11, the GaN layer 12, and the GaN layer 13 are sequentially layered on the GaN substrate 8 by using a method such as metalorganic vapor-phase epitaxy (MOVPE) or the like. As to the thickness of each GaN layer, for example, the GaN layer 9 has a thickness of 0.5 to 3 μm, the GaN layer 10 has a thickness of 5 to 20 µm, the GaN layer 12 has a thickness of 0.5 to 2 µm, and the GaN layer 13 has a thickness of 50 to 500 nm.

The composition and thickness of the $Al_xGa_{1-x}N$ layer 11 may be determined in accordance with desired 2DEG concentration and 2DHG concentration. The thickness thereof has only to be not smaller than 5 nm and not larger than 40 nm and the Al composition x thereof has only to be not smaller than 0.15 and not larger than 0.35, and in this case, the 2DEG and the 2DHG each of desired concentration can be induced by a polarization effect.

As to the impurity species and impurity concentration of each GaN layer, for example, the GaN layer 9 is doped with Si at a concentration of about $5\times10^{17}$ to $5\times10^{18}$ cm$^{-3}$ and thereby has an n-type conductivity. The GaN layer 10 is doped with Si at a concentration of about $2\times10^{14}$ to $8\times10^{16}$ cm$^{-3}$ and thereby has an n-type conductivity. The GaN layer 12 is doped with Mg at a concentration of about $1\times10^{15}$ to $1\times10^{19}$ cm$^{-3}$ and thereby has any one of p-type, i-type, and n-type conductivities. The GaN layer 13 is doped with Si at a concentration of about $5\times10^{17}$ to $1\times10^{20}$ cm$^{-3}$ and thereby has an n-type conductivity. Further, the n-type impurity species may be germanium (Ge), oxygen (O), or the like, other than Si. Similarly, the p-type impurity species may be beryllium (Be), carbon (C), zinc (Zn), or the like, other than Mg.

Further, the Mg concentration of the GaN layer 12 is set in a wide range as described above, and this is because the Mg concentration required to maintain the breakdown voltage is largely changed, depending on the thickness of the GaN layer 12 and the length thereof in the horizontal direction. In a case, for example, where the breakdown voltage is remarkably reduced by punch-through, a high-concentration p-type layer having a Mg concentration of about $5\times10^{17}$ to $1\times10^{19}$ cm$^{-3}$ should be used for the GaN layer 12. On the other hand, in another case where carrier compensation of the GaN layer 13 occurs by improvement in the channel mobility and a memory effect of Mg, the Mg concentration of the GaN layer 12 should be set at about $1\times10^{15}$ to $1\times10^{17}$ cm$^{-3}$.

Herein, the memory effect of Mg is a phenomenon in which during the epitaxial growth of the GaN layer 12, even when supply of a source gas of Mg is stopped, Mg is introduced also into the GaN layer 13 which is an upper layer, due to residual gas components in a growth chamber. In an actual use, since the donor concentration of the GaN layer 13 is set to be not lower than $1\times10^{18}$ cm$^{-3}$, only if the amount of Mg to be mixed is not higher than $1\times10^{17}$ cm$^{-3}$ which is lower by a single digit, even when the carrier compensation occurs in the GaN layer 13, it is thought that the influence is small and the sheet resistance of the GaN layer 13 hardly increases. For this reason, the Mg concentration of the GaN layer 12 is set at about $1\times10^{15}$ to $1\times10^{17}$ cm$^{-3}$.

On the other hand, in a case where such a low-concentration Mg-doped layer is formed, there arises a problem that the semiconductor device is easily punched through. In this case, by making the length of the GaN layer 12 in the horizontal direction, which is sandwiched by the trenches, as short as possible, the punch-through is suppressed. For example, by approximating an inter-trench distance which defines the source unit cell 2 to not larger than 100 nm, more preferably to not larger than 50 nm, the p-type GaN layer 12 is completely depleted or made close to the state, and invasion of drain electric field into the body region is suppressed. Since the semiconductor device thereby becomes hard to be punched through even with the low-concentration Mg-doped layer, it is possible to achieve both high breakdown voltage and high channel mobility.

Further, in a case where the Mg concentration of the GaN layer 12 is reduced, reduction in the avalanche capability may be caused by reduction in the hole carrier concentration, as well as the above-described problem of the punch-through. In the present preferred embodiment, however, since the two-dimensional hole gas (2DHG) is induced inside the GaN layer 12 in the vicinity of the interface of the $Al_xGa_{1-x}N$ layer 11 by the polarization effect occurring in a multilayer structure of the GaN layer 12, the $Al_xGa_{1-x}N$ layer 11, and the GaN layer 10, even when the Mg concentration is reduced, hole carriers are not depleted and it is thereby possible to ensure high avalanche capability.

Subsequently, in order to form the mesa structure on the side of the first main surface of the GaN substrate 8, a resist mask RM of photoresist is formed by photolithography. At that time, in a post-bake process of the photoresist, by heating the photoresist at high temperature, an end portion of the photoresist is sagged, and the resist mask RM having a forward tapered shape is obtained.

Figure 7:
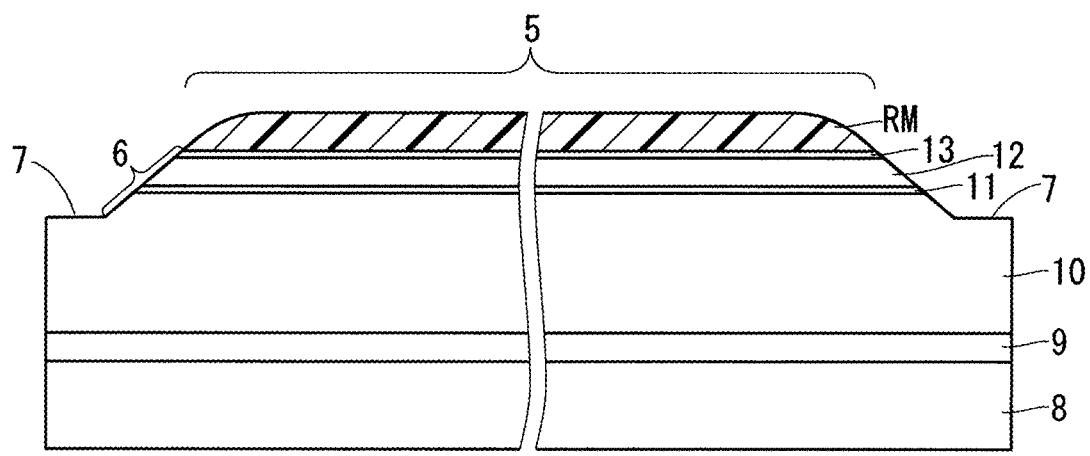
FIG. 7 is a cross section showing the method of manufacturing the semiconductor device of the first preferred embodiment in accordance with the present invention.

Next, in a process step of FIG. 7, with this resist mask RM having a forward tapered shape used as an etching mask, the mesa structure is formed on the side of the first main surface of the GaN substrate 8.

For dry etching of the GaN layers 13, 12, and 10 and the $Al_xGa_{1-x}N$ layer 11, used is an ICP-RIE (Inductive Coupled Plasma Reactive Ion Etching) device or the like. As a gas used for processing, it is preferable to use chlorine (Cl) or boron trichloride (BCl$_3$). By performing this etching, respective portions of the GaN layers 13 and 12 and the $Al_xGa_{1-x}N$ layer 11 which are not covered with the resist mask RM are removed. Further, the GaN layer 10 is removed up to a predetermined thickness. After the processing by etching, the resist mask RM is removed by organic cleaning or the like.

By performing mesa processing, the mesa structure having the upper surface portion 5, the side surface portion 6, and the bottom surface portion 7 is formed on the side of the first main surface of the GaN substrate 8. The height difference between the upper surface portion 5 and the bottom surface portion 7 is 1 to 2 µm, and the tilt angle of the forward-tapered mesa is not larger than 60 degrees. By forming such a mesa structure, it is possible to sufficiently achieve an electric field relaxation effect with the inclined field plate structure.

After forming the mesa structure on the side of the first main surface of the GaN substrate 8 through the above process, the gate cell 1, the source unit cell 2, and the termination cell 3 are formed. Hereinafter, description will be made, centering on formation of the source unit cell 2 which is a featured part of the present preferred embodiment.

Figure 8:
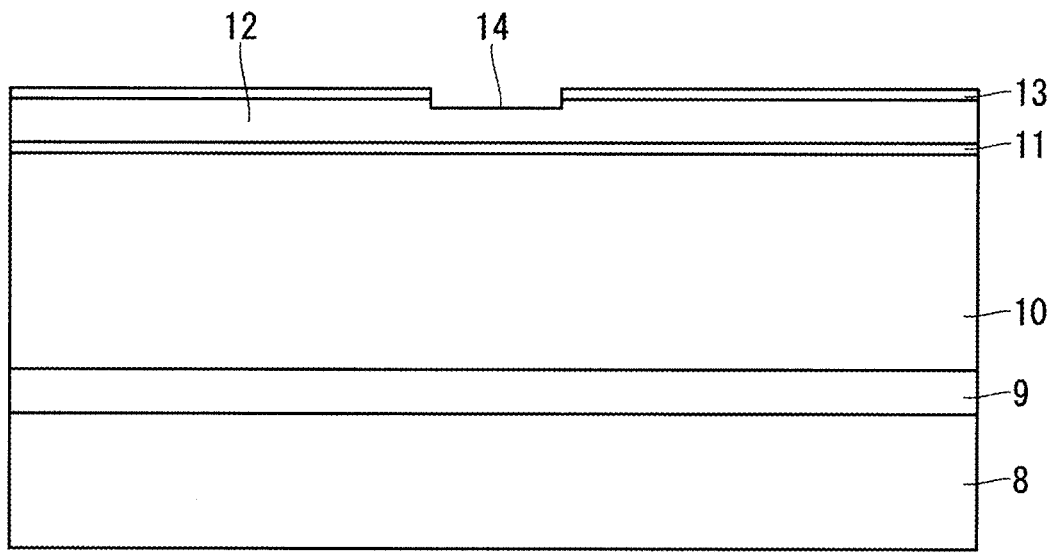
FIG. 8 is a cross section showing the method of manufacturing the semiconductor device of the first preferred embodiment in accordance with the present invention.

First, by photolithography, a resist mask (not shown) having an opening at a portion corresponding to a region for formation of the body contact 14 is formed on the GaN layer 13 in the upper surface portion 5 of the mesa structure. After that, dry etching of the GaN layer 13 is performed by using the ICP-RIE device or the like with this resist mask used as an etching mask. For this dry etching, used is a chlorine-based gas such as Cl, BCl$_3$, or the like. The etching condition has only to be adjusted as appropriate so that the GaN layer 12 should be exposed in the bottom portion of the body contact 14. After that, by performing organic cleaning or the like to remove the resist mask, the body contact 14 shown in FIG. 8 is obtained.

Figure 9:
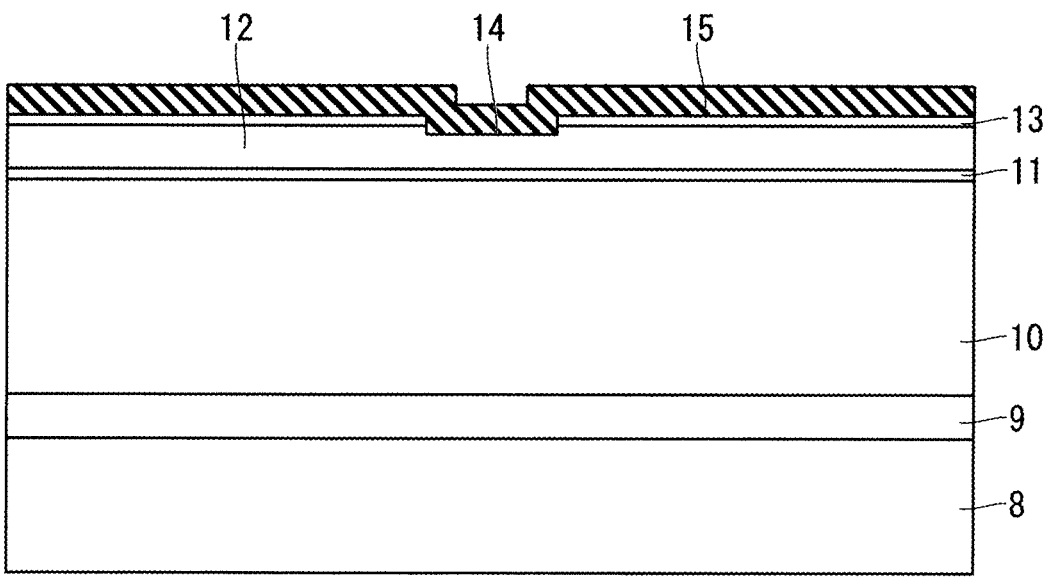
FIG. 9 is a cross section showing the method of manufacturing the semiconductor device of the first preferred embodiment in accordance with the present invention.

Next, in a process step of FIG. 9, the insulating film 15 is formed on the GaN layer 13 by the sputtering method, the chemical vapor deposition (CVD) method, the coating method, or the like. As the kind of film, silicon oxide ($SiO_2$), silicon nitride ($Si_3N_4$), alumina ($Al_2O_3$), aluminum nitride (AlN), aluminum oxynitride (AlON), gallium oxide ($Ga_2O_3$), or the like may be used. The film thickness may be set in consideration of the resistance as a hardmask, the parasitic capacitance between the gate electrode 18 and the GaN layer 13, or the like, and is preferably about 100 to 500 nm.

After forming the insulating film 15, a resist mask (not shown) is formed on the insulating film 15 by photolithography. This resist mask has a pattern for processing the insulating film 15 as a hardmask to be used for formation of the trench gate 4. After that, the insulating film 15 is patterned by using, for example, a RIE (Reactive Ion Etching) device with this resist mask used as an etching mask. The gas to be used for this etching and the etching condition may be selected as appropriate from well-known techniques in accordance with the kind of the insulating film 15. Finally, the resist mask is removed by organic cleaning or the like.

Figure 10:
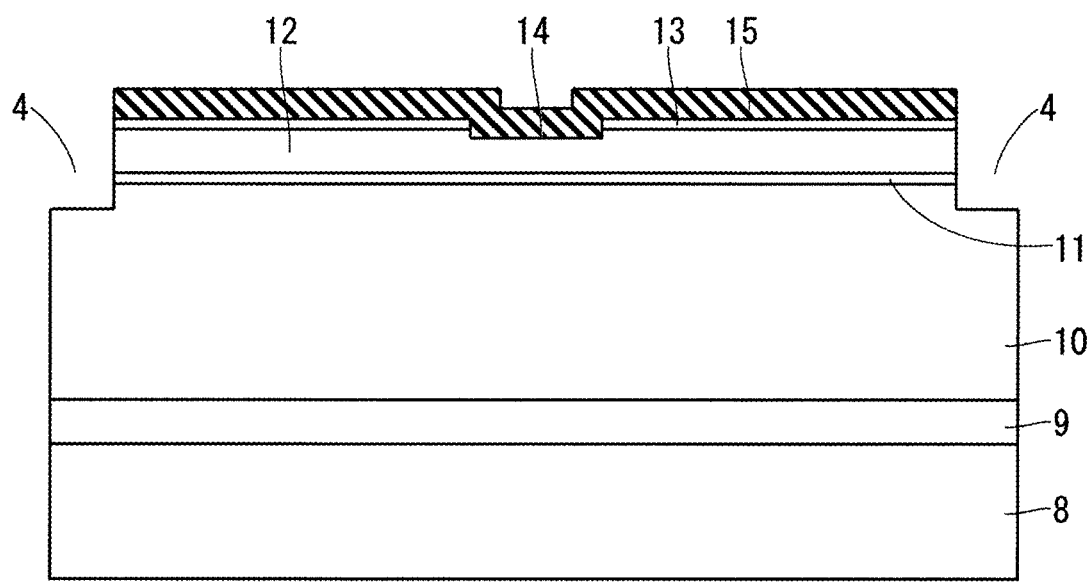
FIG. 10 is a cross section showing the method of manufacturing the semiconductor device of the first preferred embodiment in accordance with the present invention.

Next, in a process step of FIG. 10, the GaN layers 13, 12, and 10 and the $Al_xGa_{1-x}N$ layer 11 are selectively removed by dry etching using the ICP-RIE device or the like with the patterned insulating film 15 used as a hardmask, to thereby form the trench gate 4.

The etching gas used for this dry etching is preferably a chlorine-based etching gas such as Cl, $BCl_3$, or the like. It is known that the etching rate of $Al_xGa_{1-x}N$ in a case where the chlorine-based etching gas is used is quite lower than that of GaN. For this reason, by forming the $Al_xGa_{1-x}N$ layer 11 in the vicinity of the bottom portion of the trench gate 4, like in the present preferred embodiment, the $Al_xGa_{1-x}N$ layer 11 can be used as an etching stopper for trench processing.

Specifically, in a case where trench processing is performed by using an end point detector, when the luminescence intensity of plasma is changed, it can be seen that a trench edge reaches the $Al_xGa_{1-x}N$ layer 11, and when the luminescence intensity is changed again, the trench edge reaches the GaN layer 10. It is thereby possible to accurately detect a position of the trench edge and accurately determine a timing for stopping the etching. For this reason, it becomes easy to make the bottom surface of the trench gate 4 closer to an end portion on the side of an n layer of a hetero pin junction formed of the GaN layer 12, the $Al_xGa_{1-x}N$ layer 11, and the GaN layer 10, i.e., an upper surface of the GaN layer 10, and it becomes easy for a depletion layer extending from the hetero pin junction to cover the bottom portion of the trench gate 4. The electric field relaxation effect is thereby increased and dielectric breakdown at the bottom portion of the trench gate 4 can be suppressed.

Further, by making the bottom surface of the trench gate 4 closer to the upper surface of the GaN layer 10, an overlap length between the gate electrode 18 and the GaN layer 10 can be suppressed to the minimum, and it is therefore possible to reduce the parasitic capacitance and increase the switching speed.

Figure 11:
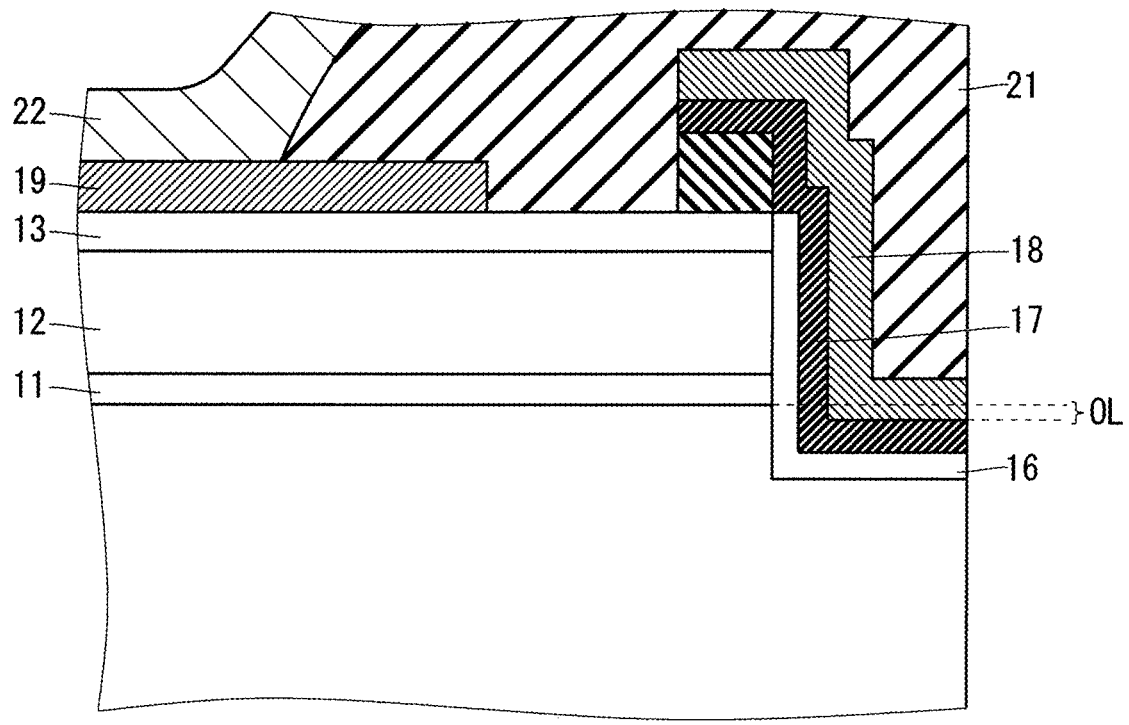
FIG. 11 is a view showing an overlap length between a gate electrode and a GaN layer.

Herein, with reference to FIG. 11, the overlap length of the gate electrode 18 and the GaN layer 10 will be described. As shown in FIG. 11, the difference between the upper surface of the GaN layer 10 and a surface (lower surface) of the gate electrode 18, which faces the bottom surface of the trench gate, is defined as an overlap length OL. As the trench gate 4 becomes deeper and the overlap length OL becomes larger, the parasitic capacitance becomes larger and the switching speed is reduced.

Therefore, though it is desired that the trench gate 4 should be shallow, when the trench gate 4 becomes too shallow and the lower surface of the gate electrode 18 is positioned upper than the upper surface of the GaN layer 10, this causes an underlap where the channel is not connected to the n-type impurity layer and the device is brought into a high-resistance state. Then, by setting the depth of the trench gate 4 so that the upper surface of the GaN layer 10 should be even with the lower surface of the gate electrode 18 or the gate electrode 18 and the GaN layer 10 should overlap each other, the channel is reliably connected to the n-type impurity layer and the ON resistance can be kept low.

Figure 12:
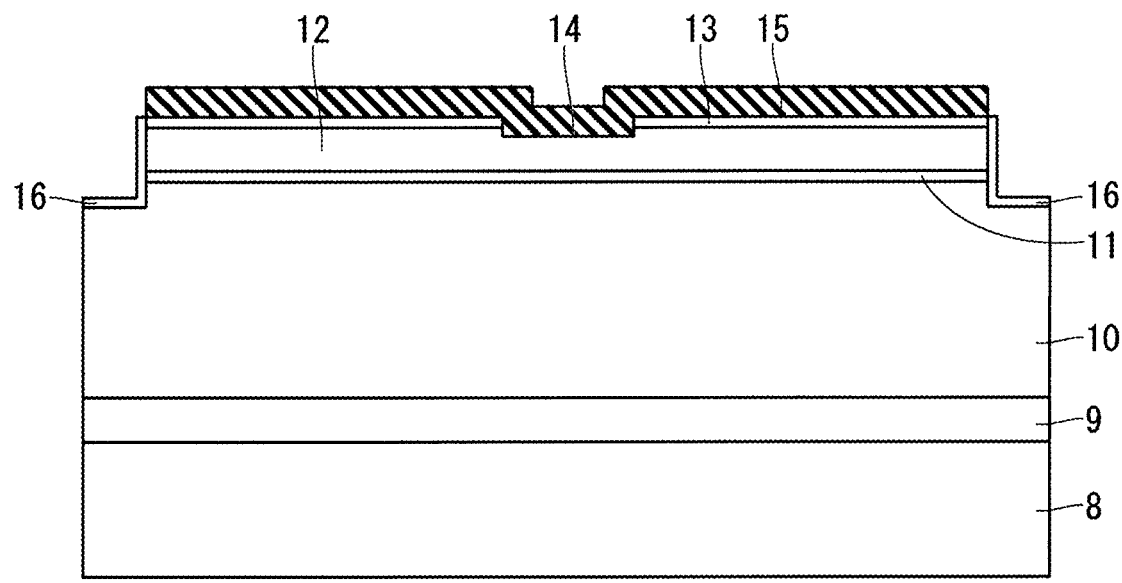
FIG. 12 is a cross section showing the method of manufacturing the semiconductor device of the first preferred embodiment in accordance with the present invention.

Next, the GaN substrate 8 is cleaned in the state where the trench gate 4 is formed, and in a process step of FIG. 12, by using the MOVPE method or the like, the GaN layer 16 is epitaxially grown and formed on the inner surface of the trench gate 4. Since all the part of the trench gate 4, other than the inner surface, is covered with the insulating film 15, the GaN layer 16 can be selectively formed only on the bottom surface and side surface of the trench gate 4. When this method is adopted, since the GaN layer 16 on the side surface of the trench gate 4, on which the channel layer is formed, can be formed by epitaxial growth, respective acceptor concentrations of the channel layer and the body region can be individually set. Specifically, the acceptor concentration of the GaN layer 12 serving as the body region can be set high in terms of prevention of the punch-through, reduction in the contact resistance with the source electrode 19, and the like, and the acceptor concentration of the GaN layer 16 in which the channel layer is formed can be set low in terms of improvement of the mobility.

Further, in the epitaxial growth of the GaN layer 16, when the film thickness of the GaN layer 16 is set thick, the ON resistance sometimes remarkably increases. This phenomenon occurs in a case where a potential barrier of the GaN layer 16 remains between the channel layer in the bottom portion of the trench gate 4 and the GaN layer 10 in a conducting state of the transistor. In order to avoid this phenomenon, it is desirable that the thickness of the GaN layer 16 should be set not larger than that of the channel layer. Specifically, the thickness of the GaN layer 16 is preferably not larger than 10 nm, and more preferably about 5 nm.

After the GaN layer 16 is epitaxially grown, heat treatment is performed on the GaN substrate 8 at a temperature of about 600 to 900° C. Hydrogen ($H_2$) is thereby desorbed from the GaN layer 12 and the GaN layer 16, and these layers function as active p-type impurity layers.

Figure 13:
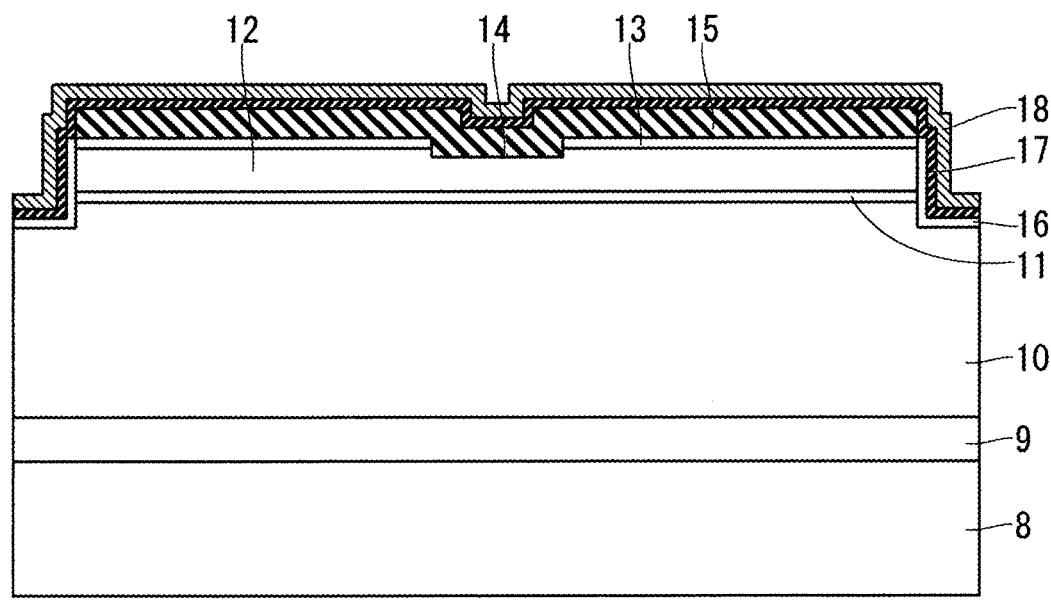
FIG. 13 is a cross section showing the method of manufacturing the semiconductor device of the first preferred embodiment in accordance with the present invention.

Next, the GaN substrate 8 is cleaned in the state where the GaN layer 16 is formed, and in a process step of FIG. 13, after removing organic substances, particles, metal impurities, and the like, the gate insulating film 17 is formed inside the trench gate 4 and on the insulating film 15. As a preferable method of forming the gate insulating film 17, the CVD method, the atomic layer (vapor) deposition (ALD) method, the sputtering method, or the like may be adopted. As the kind of the gate insulating film 17, $SiO_2$, $Si_3N_4$, $Al_2O_3$, AlN, AlON, gallium oxide ($Ga_2O_3$), or the like may be used. The film thickness thereof is preferably about 30 to 150 nm.

Further, the gate insulating film 17 is not necessarily a monolayer film but may be a laminated layer film containing $SiO_2$. When the gate insulating film 17 contains $SiO_2$, reliability can be increased. Furthermore, after forming the gate insulating film 17, improvement of film quality of the gate insulating film 17 may be performed by the annealing process or the like.

In the present preferred embodiment, adopted is the gate first process in which the gate stack process is performed before forming a source electrode and a drain electrode. For this reason, the semiconductor device of the present preferred embodiment has some merits as compared with a semiconductor device obtained by the gate last process, in terms of not restricting the liquid medicine to be used in the cleaning process before forming the gate insulating film 17 and not restricting the annealing temperature and the annealing atmosphere for the improvement of film quality after forming the gate insulating film 17. Therefore, as compared with a general GaN device obtained by adopting the gate last process, the vertical trench MOSFET 100 of the present preferred embodiment can achieve high reliability.

After forming the gate insulating film 17, the gate electrode 18 is so formed as to cover the gate insulating film 17. Since the gate first process is adopted in the present preferred embodiment as described above, it is necessary to perform ohmic sintering of the source electrode and the drain electrode after forming the gate electrode 18. For this reason, since the gate electrode 18 is required to have high heat resistance, as a material of the gate electrode 18, it is desirable to use a refractory metal or a compound thereof, such as titanium nitride (TiN), tungsten (W), molybdenum (Mo), molybdenum silicide ($MoSi_x$), tungsten silicide ($WSi_x$), titanium silicide ($TiSi_x$), tantalum silicide ($TaSi_x$), or the like. Further, polycrystalline silicon (Poly-Si) may be used.

Furthermore, the gate electrode 18 is not necessarily a monolayer film but may be a laminated layer film formed of a metal gate and Poly-Si gate. As a method of forming the gate electrode 18, the sputtering method, the CVD method, the ALD method, or the like may be adopted. The film thickness thereof is about 100 nm to 1 μm.

Next, the gate electrode 18 is patterned. In a case where the gate electrode 18 is a metal gate, first, a resist mask having an opening corresponding to a portion of the gate electrode 18 which is to be removed is formed on the gate electrode 18 by the photolithography process. After that, the gate electrode 18 is selectively etched by using the resist mask as an etching mask. The method of etching the metal gate may be selected as appropriate from well-known techniques in accordance with properties of the gate material. After patterning the gate electrode 18, the resist mask is removed by organic cleaning or the like.

Further, in another case where the gate electrode 18 is a film, such as Poly-Si or the like, which is obtained by CVD, the gate electrode can be patterned only by etchback, with the photolithography process omitted. In this case, a Poly-Si film is formed to have a thickness enough to bury the trench gate 4 and then etched back, to be thereby left inside the trench gate 4. Then, in the gate cell 1, a contact hole is disposed immediately above the trench gate 4 in the vicinity of the gate cell 1, and the gate pad electrode 23 is brought into contact with the Poly-Si film inside the trench gate 4. In this case, the etch stop electrode 24 is not needed in the gate cell 1, and most of the gate cell 1, except an upper portion of the trench gate 4, is covered with the insulating film 21. As the etching gas used in this case, for example, sulfur hexafluoride ($SF_6$) or the like is suitably used.

Figure 14:
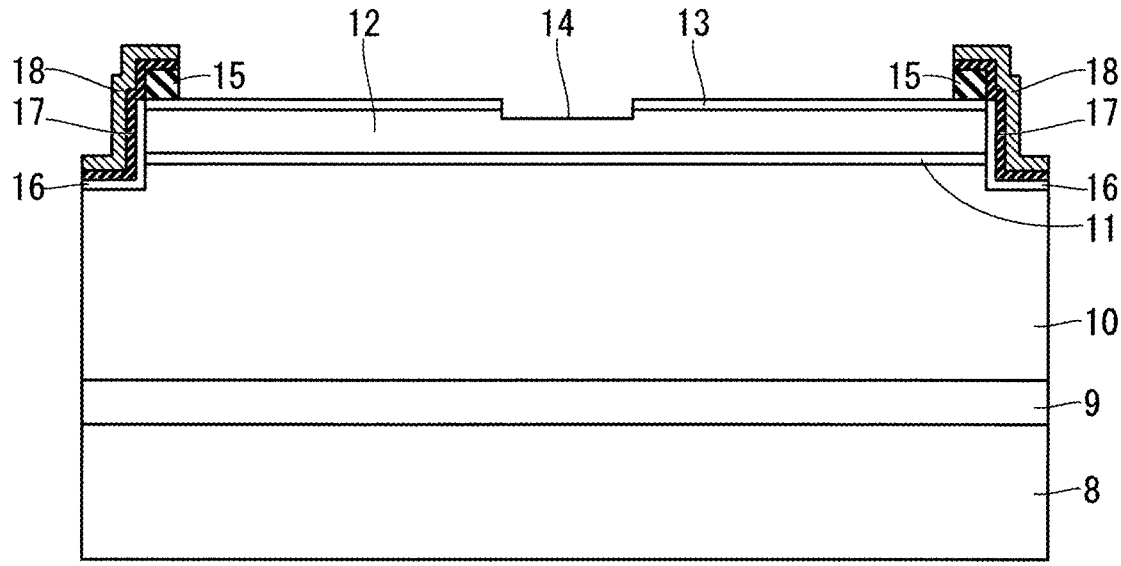
FIG. 14 is a cross section showing the method of manufacturing the semiconductor device of the first preferred embodiment in accordance with the present invention.
Figure 15:
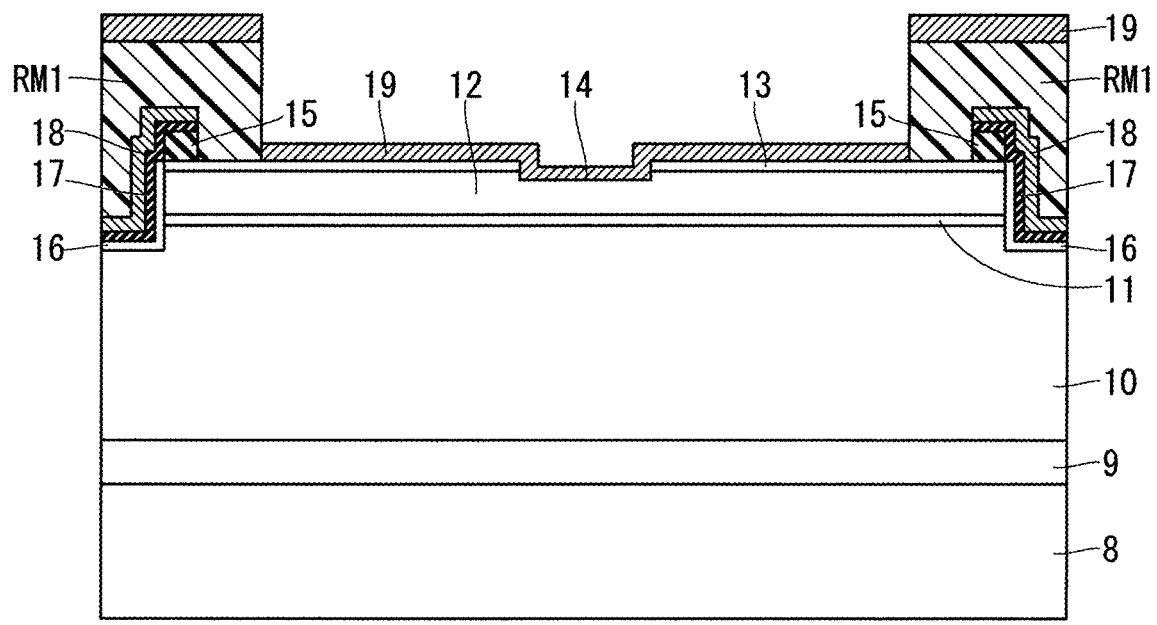
FIG. 15 is a cross section showing the method of manufacturing the semiconductor device of the first preferred embodiment in accordance with the present invention.

Next, in a process step of FIG. 14, the insulating film 15 and the gate insulating film 17 are etched by using the patterned gate electrode 18 as an etching mask. In a case where the insulating film 15 and the gate insulating film 17 are each $SiO_2$, by using buffered hydrofluoric acid (BHF), the $SiO_2$ in an unnecessary portion which is not covered with the gate electrode 18 can be removed.

Next, the source electrode 19 is formed. First, in a process step of FIG. 15, a resist mask RM1 having an opening corresponding to a portion in which the source electrode 19 is to be formed is formed by the photolithography process. After that, the source electrode 19 is formed by using the EB (Electron Beam) evaporation method or the like. In the EB evaporation method, a forming material of the source electrode is evaporated by an electron beam, and the evaporated forming material of the source is deposited on a bottom surface of the opening of the resist mask RM1 and on the resist mask RM1, to thereby form a metal film.

Further, as the material of the source electrode 19, for example, titanium (Ti), aluminum (Al), platinum (Pt), nickel (Ni), vanadium (V), niobium (Nb), copper (Cu), molybdenum (Mo), palladium (Pd), silver (Ag), gold (Au), or the like may be used. The source electrode 19 is not necessarily a monolayer film of such a material but may be a multilayer film, or may be formed by layering a plurality of films selected out of the above materials. When the EB evaporation method is adopted, a multilayer film can be formed only by changing these materials.

Furthermore, a high work-function metal film may be partially formed between the source electrode 19 and the body contact 14. As this metal film, Ni, Pd, Pt, Au, or the like may be used. In this case, there may be a structure where the source electrode 19 is a multilayer film and the bottom layer film thereof is a metal film of such a material. Since it becomes easier for the source electrode 19 to come into contact with the p-type GaN layer 12 by adopting such a structure, the body potential is stabilized and variation in the threshold voltage is reduced. Further, since it becomes easier to draw holes from the body region, the avalanche capability is increased.

For the top layer of the source electrode 19, it is preferably to form a film which is hardly etched during the etching of the insulating film 21, and to use, for example, an Au film.

After forming the metal film, by lifting off the resist mask RM1, an unnecessary portion of the source electrode 19 is removed and the source electrode 19 remains only on the GaN layer 13 and the body contact 14.

Further, though description with reference to figures is omitted, the etch stop electrode 24 disposed above the gate electrode 18 in the gate cell 1 can be formed simultaneously with the source electrode 19. By disposing the etch stop electrode 24 above the gate electrode 18, it becomes not only easier to set an etching time in the formation of the contact hole but also possible to adopt a metal material having no dry etching resistance for the gate electrode 18. In other words, it becomes possible to select the material of the gate electrode 18 in terms of the work function, the heat resistance, and the patterning property. Further, in the present preferred embodiment, though the source electrode 19 and the etch stop electrode 24 are simultaneously formed of the same material, different names are used therefor for convenience.

Figure 16:
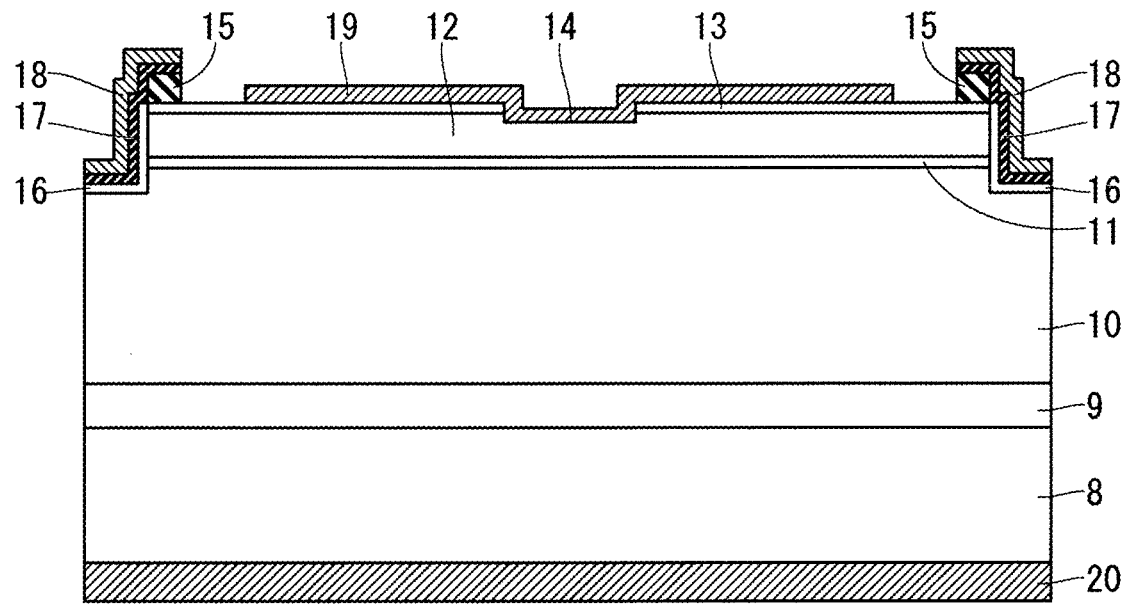
FIG. 16 is a cross section showing the method of manufacturing the semiconductor device of the first preferred embodiment in accordance with the present invention.

After forming the source electrode 19, in a process step of FIG. 16, the drain electrode 20 is formed on the second main surface of the GaN substrate 8. The material and the forming method of the drain electrode 20 are the same as those of the source electrode 19.

After forming the source electrode 19 and the drain electrode 20, the sintering process is performed at a temperature of about 500 to 800° C. to obtain an ohmic contact.

As to the sintering condition, the process is preferably performed for about 10 to 30 minutes in the nitrogen atmosphere.

Figure 17:
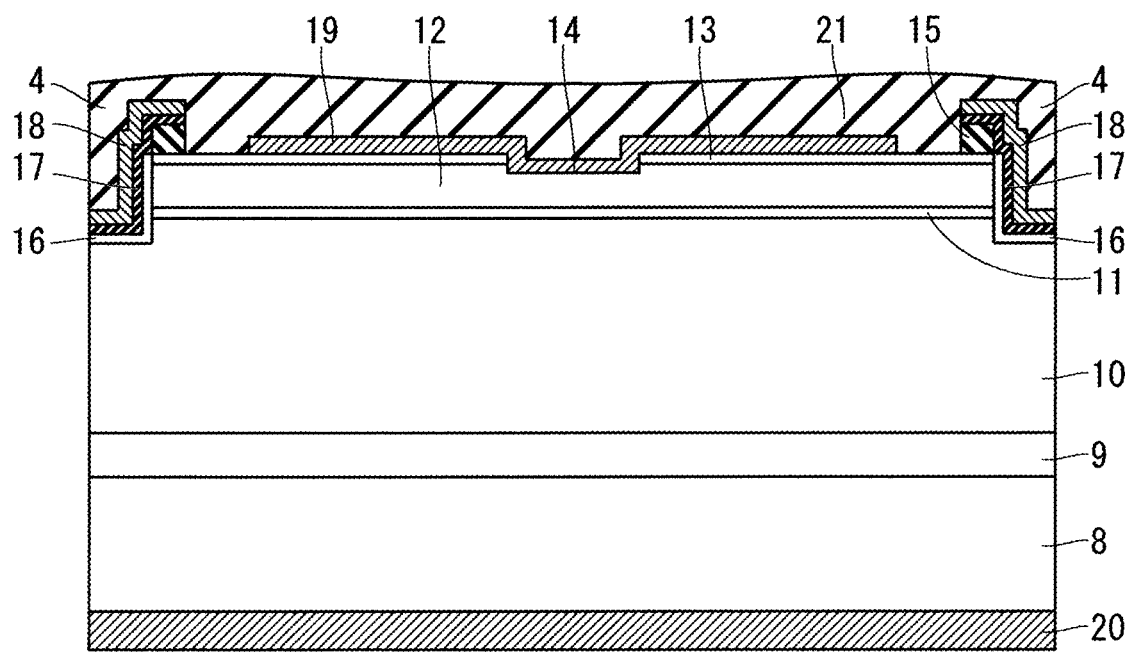
FIG. 17 is a cross section showing the method of manufacturing the semiconductor device of the first preferred embodiment in accordance with the present invention.

Next, in a process step of FIG. 17, the insulating film 21 is formed on the side of the first main surface of the GaN substrate 8 in a state where the source electrode 19 and the drain electrode 20 are formed. On the side of the first main surface of the GaN substrate 8 in this state, there are large projections and depressions since the mesa structure and the trench gate 4 are formed, and there is a possibility that the pad electrode may be broken.

Then, in order to make the substrate flat, it is preferable to use a coating type insulating film such as a spin-on-glass (SOG) film or the like for the insulating film 21. As the insulating film, used is a siloxane resin film containing silicon. As to this film, a siloxane resin is mixed into an organic solvent to make an organic siloxane resin solution and this solution is applied and cured (sintered), to thereby form a silicon oxide film with the organic component sublimated.

Further, since the SOG film has some problems such as adhesion, occurrence of crack, occurrence of poisoned via, and the like, it is preferable to provide a sandwich structure in which the SOG film is sandwiched by the $SiO_2$ films or the like which are formed above and below the SOG film by the CVD method or the ALD method.

Figure 18:
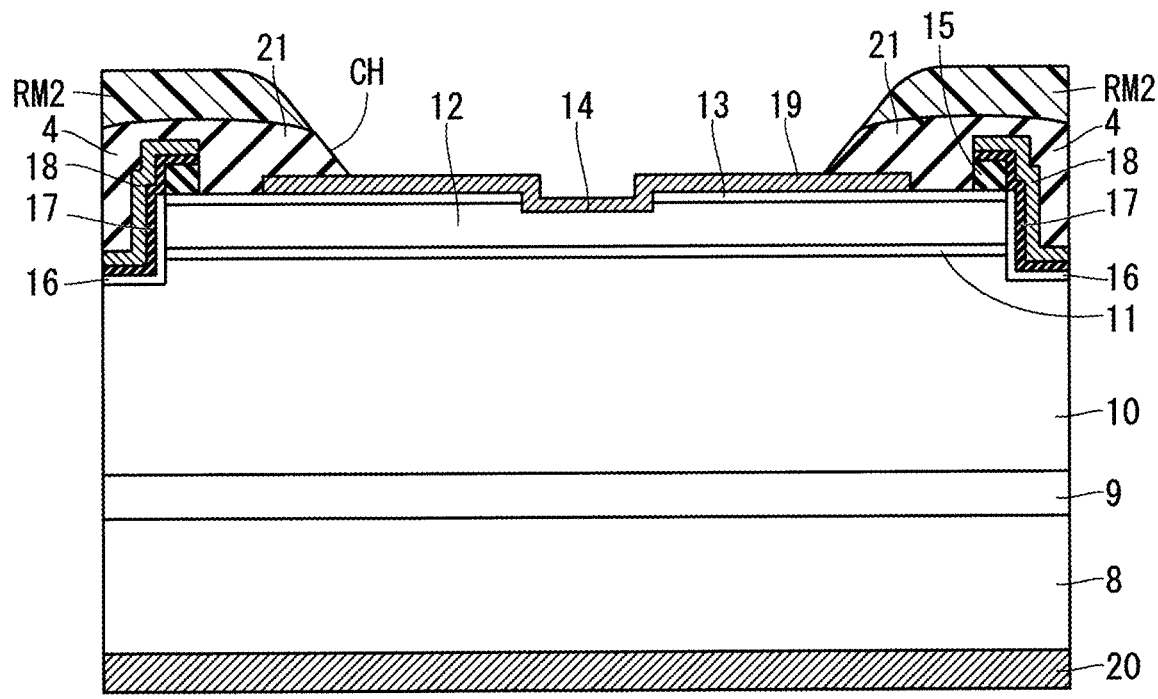
FIG. 18 is a cross section showing the method of manufacturing the semiconductor device of the first preferred embodiment in accordance with the present invention.

Next, in a process step of FIG. 18, a contact hole CH is formed in the insulating film 21. First, a resist mask RM2 having an opening corresponding to a portion in which the contact hole CH is to be formed is formed on the insulating film 21 by the photolithography process. It is desirable that a cross-sectional shape of the contact hole CH should be inclined in a forward tapered shape in order to suppress disconnection caused by step in the pad electrode. For achieving such a cross-sectional shape, in a post-bake process of the photoresist, by heating the photoresist at high temperature, an opening end of the photoresist is sagged and the forward-tapered resist mask RM2 shown in FIG. 18 is thereby obtained.

With this resist mask RM2 used as an etching mask, dry etching is performed by using the RIE, and the contact hole CH which penetrates the insulating film 21 to reach the source electrode 19 is thereby formed.

Further, in a case where the material of the insulating film 21 is $SiO_2$, it is preferable to use fluoroform ($CHF_3$) as an etching gas. In a case where Au is used for the source electrode 19 and the etch stop electrode 24 as described earlier, since Au has high dry etching resistance, there is no possibility that the dry etching may go through the gate electrode 18 in the gate cell 1 and the source electrode 19 in the source unit cell 2 during the dry etching. Furthermore, the source electrode 19 and the etch stop electrode 24 can be referred to as a protection electrode.

Next, a pad electrode is formed. First, a resist mask having an opening corresponding to a portion in which the pad electrode is to be formed is formed on the insulating film 21 by the photolithography process. After that, by the EB evaporation method, a metal film is formed of a monolayer film of Ti, Al, Pt, Ni, V, Nb, Cu, Mo, Pd, Au, or the like or a multilayer film of some of these elements, and thereafter, by lifting off the resist mask, an unnecessary portion of the metal film is removed. By performing this process, a source pad electrode 22 connected to the source electrode 19 is formed in the source unit cell 2 (FIG. 2) and a gate electrode 23 connected to the etch stop electrode 24 is formed in the gate cell 1 (FIG. 3). In a case where a thick pad electrode is needed due to some problems such as the heat dissipation of the semiconductor device, the disconnection caused by step in the pad electrode, and the like, the pad electrode may be formed by the sputtering method. In this case, after forming the pad electrode, patterning has only to be performed by the photolithography process and the dry etching process, Further, an end portion of the source pad electrode 22 is inclined on the insulating film 21 in the termination cell 3 toward the bottom surface portion 7 of the mesa structure and has a termination portion on the bottom surface portion 7 (FIG. 4).

By flattening of the SOG film, the thickness of the insulating film 21 becomes larger in a phased manner from the upper surface portion 5 toward the bottom surface portion 7 of the mesa structure and the inclined field plate structure is thereby formed. It is thereby possible to reduce the electric field concentration at the chip termination portion and increase the breakdown voltage in the vertical trench MOSFET 100.

According to the vertical trench MOSFET 100 of the first preferred embodiment described above, since the current spreading layer (CSL) is formed of the two-dimensional electron gas (2DEG) generated in the vicinity of the interface between the $Al_xGa_{1-x}N$ layer 11 and the GaN layer 10, the current after passing the channel layer on the side surface of the trench gate 4 comes to be easily spread and the ON resistance is reduced. Further, since no additional doping is needed for forming the current spreading layer CSL, the breakdown voltage is not damaged. As a result, in comparison between the MOSFET adopting the structure of the present preferred embodiment and a MOSFET not adopting the structure, under the condition of the same breakdown voltage, the MOSFET adopting the structure of the present preferred embodiment can significantly reduce the ON resistance.

Further, by using an etch stop effect of the $Al_xGa_{1-x}N$ layer 11, it becomes easier to make the bottom surface of the trench gate 4 closer to the end portion on the side of the n layer of the pin junction, i.e., the upper surface of the GaN layer 10. Since the depletion layer extending from the pin junction thereby comes to easily cover the bottom portion of the trench gate 4 and the electric field relaxation effect is increased, it is possible to suppress the dielectric breakdown at the bottom portion of the trench gate 4 and increase the breakdown voltage. Furthermore, since the overlap length between the gate electrode 18 and the GaN layer 10 can be suppressed to the minimum, it is possible to reduce the parasitic capacitance and increase the switching speed.

Further, since the GaN layer 16 is formed by epitaxial growth on the side surface of the trench gate 4 in which the channel layer is formed, it is possible to individually set the respective acceptor concentrations of the channel layer and the body region to optimum concentrations. It is thereby possible to achieve both high punch-through resistance (high breakdown voltage) and high channel mobility.

Furthermore, by reducing the Mg concentration of the GaN layer 12 while reducing the inter-trench distance, it is possible to keep the punch-through resistance and suppress of the memory effect of Mg. Since the amount of Mg to be unintentionally doped into the GaN layer 13 can be reduced, the carrier compensation is relieved and an increase in the sheet resistance of the GaN layer 13 can be suppressed.

Further, since the two-dimensional hole gas (2DHG) which uses the polarization effect occurring in the multilayer structure of the GaN layer 12, the $Al_xGa_{1-x}N$ layer 11, and the GaN layer 10 is induced inside the GaN layer 12, even when the Mg concentration of the GaN layer 12 is reduced, the hole carriers are not depleted and it is thereby possible to ensure high avalanche capability.

Furthermore, since the ON resistance can be reduced in the vertical trench MOSFET 100 of the first preferred embodiment as described above, it is possible to reduce a chip area required to achieve a rated current. In a case of a semiconductor including much dislocation, such as GaN, the reduction in the chip area significantly contributes to an increase in the yield of the chip.

Variations

In the vertical trench MOSFET 100 of the first preferred embodiment described above, the thickness of the GaN layer 16 is set thin in a range from 5 nm to 10 nm in order to reduce the ON resistance. In a case where the thickness of the GaN layer 16 is set thin, however, the crystal quality of the channel layer is sometimes hard to increase due to a crystal damage of the side surface of the trench gate 4 and contamination of the impurity from the side surface of the trench gate 4. In such a case, the GaN layer 16 may be formed to be thick and then etched back by using the ICP-RIE device or the like, to selectively remove the GaN layer 16 at the bottom portion of the trench gate 4.

Figure 19:
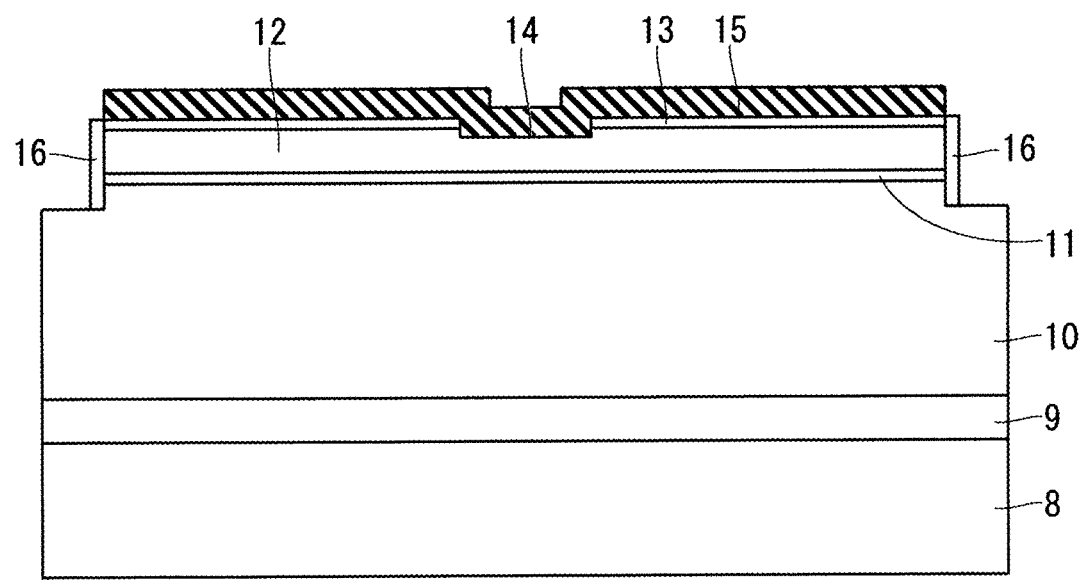
FIG. 19 is a cross section showing a method of manufacturing a semiconductor device of a variation of the first preferred embodiment in accordance with the present invention.

FIG. 19 is a cross section showing a state of the source unit cell 2 after the etchback, and the thick GaN layer 16 remains on the side surface of the trench gate 4 and the GaN layer 16 on the bottom portion of the trench gate 4 has been removed.

Thus, by adopting the structure in which the GaN layer 16 is provided only on the side surface of the trench gate 4, restriction on the thickness of the GaN layer 16 is eliminated and it is thereby possible to increase the thickness of the GaN layer 16. This makes it possible to increase a distance between a growth interface of an epitaxial growth layer and a channel interface, and the channel layer becomes less susceptible to the effects of the crystal damage of the side surface of the trench gate 4 and the contamination of the impurity and an increase in the quality of the channel layer can be thereby expected. Further, it is assumed that the thickness of the GaN layer 16 on the side surface of the trench gate 4 is not smaller than 10 nm and not larger than 1 μm.

Figure 20:
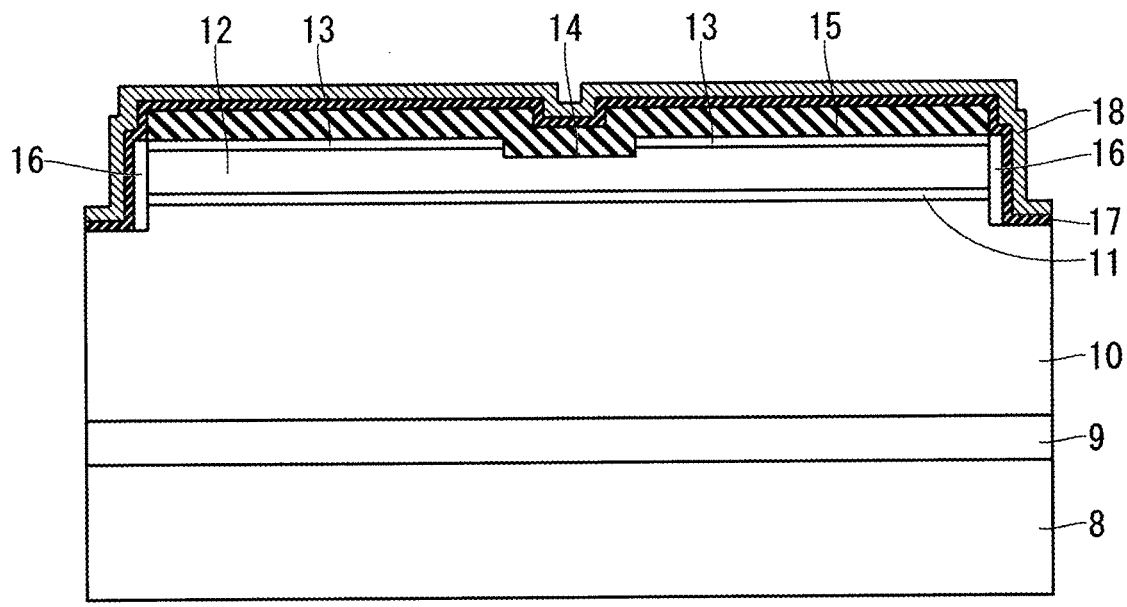
FIG. 20 is a cross section showing the method of manufacturing the semiconductor device of the variation of the first preferred embodiment in accordance with the present invention.

After that, in a process step of FIG. 20, the gate insulating film 17 is formed inside the trench gate 4 and on the insulating film 15. After this formation, the gate electrode 18 is formed on the gate insulating film 17. On the bottom portion of the trench gate 4, the gate insulating film 17 and the gate electrode 18 are layered without the GaN layer 16 interposed therebetween.

Further, the GaN layer 12 and the GaN layer 16 are doped with Mg as a p-type impurity. The p-type GaN is, however, susceptible to a process damage and can become an i-type or n-type one due to unintentional contamination of the impurity, carrier compensation caused by a donor-type defect, or the like. When the conductivity types of the GaN layer 12 and the GaN layer 16 are p type, the device operates as a normal n-type MOSFET, and the present first preferred embodiment and the second preferred embodiment described later are (will be) described, assuming that the conductivity types of the GaN layer 12 and the GaN layer 16 are p type. Furthermore, also when the conductivity types of the GaN layer 12 and the GaN layer 16 are i type or n type, the device operates as a MOSFET. Specifically, since there are carriers even in a state where no gate bias is applied, the device operates as a normally-on type MOSFET. When the conductivity types of the GaN layer 12 and the GaN layer 16 are i type or n type, the device can be used as a normally-on type MOSFET.

Further, in the case where the conductivity types of the GaN layer 12 and the GaN layer 16 are i type or n type, the ON resistance during conduction can be reduced. For this reason, in a case where it is important to reduce a conduction loss, sometimes, the GaN layer 12 and the GaN layer 16 are intentionally made i type or n type, and the device is operated as a normally-on type MOSFET.

The Second Preferred Embodiment

Device Structure

Figure 21:
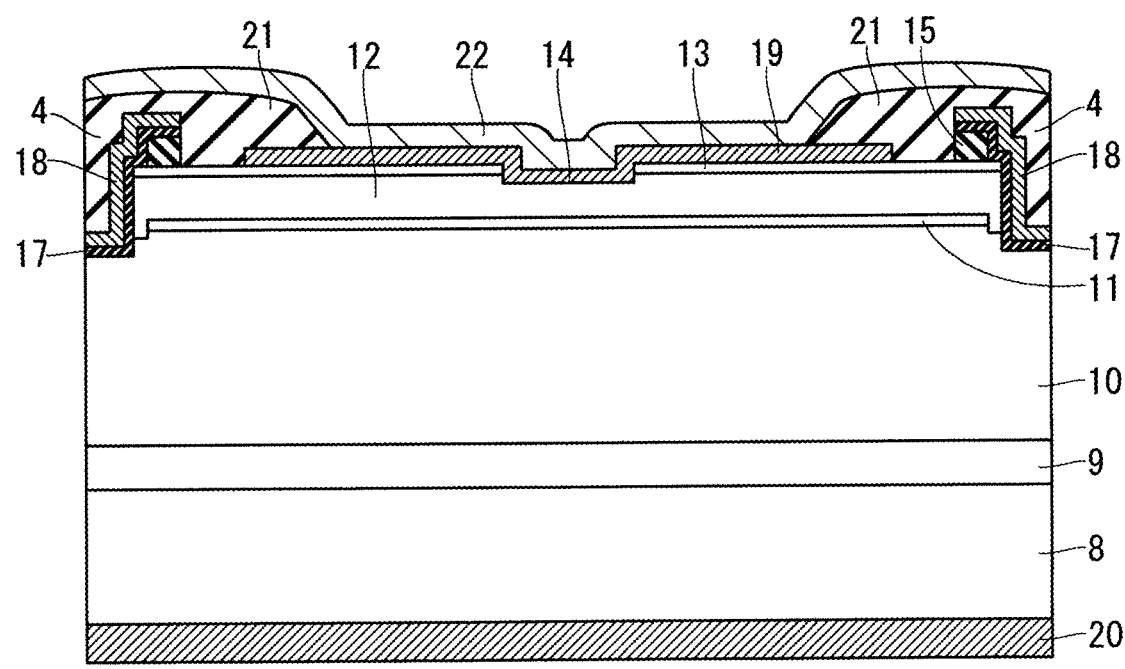
FIG. 21 is a cross section showing a source unit cell of a semiconductor device of a second preferred embodiment in accordance with the present invention.
Figure 2:
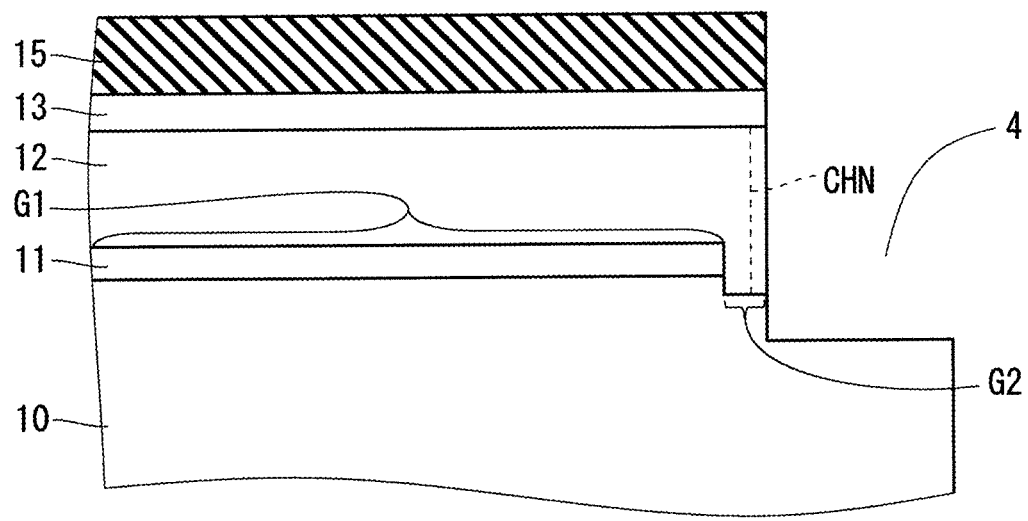
Figure 2:
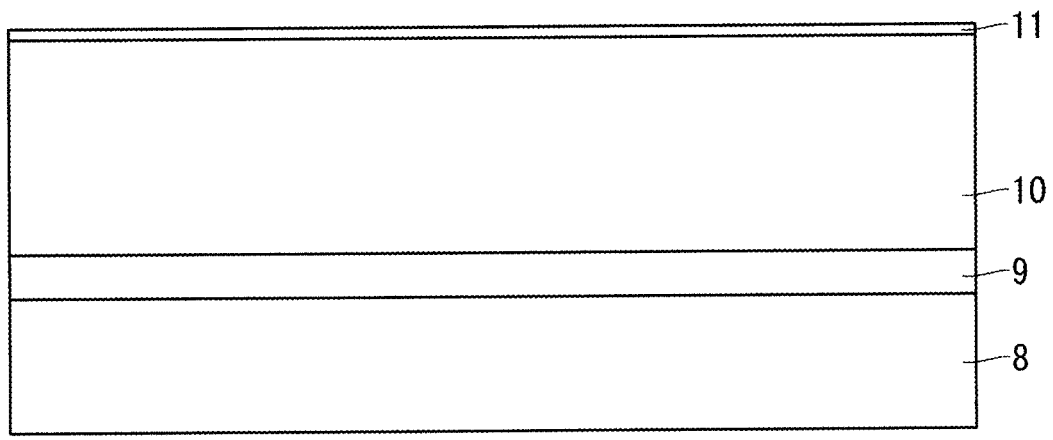

FIG. 21 is a cross section showing a source unit cell of a vertical trench MOSFET 200 of the second preferred embodiment in accordance with the present invention. As shown in FIG. 21, the vertical trench MOSFET 200 has almost the same structure as that of the vertical trench MOSFET 100 described with reference to FIG. 2, and constituent elements identical to those of the vertical trench MOSFET 100 are represented by the same reference signs and redundant description thereof will be omitted.

In the vertical trench MOSFET 200 of FIG. 21, disposition of the epitaxial growth layer in the periphery of the trench gate 4 is different from that in the vertical trench MOSFET 100. Specifically, the end surface of the $Al_xGa_{1-x}N$ layer 11 in the horizontal direction does not reach the side surface of the trench gate 4, and the GaN layer 12 is interposed between the end surface of the $Al_xGa_{1-x}N$ layer 11 in the horizontal direction and the side surface of the trench gate 4. Further, the GaN layer 16 is not formed on the inner surface of the trench gate 4 and the gate insulating film 17 is in contact with the inner surface of the trench gate 4.

According to the present preferred embodiment, since no p-type GaN layer exists on the bottom surface of the trench gate 4, it becomes easier to directly connect the channel on the side wall of the GaN layer 12 to the GaN layer 10. Since this eliminates the parasitic capacitance between the channel layer and the GaN layer 10, it is possible to further reduce the ON resistance. Since there is no parasitic capacitance between the channel layer and the GaN layer 10, it is possible to further reduce the ON resistance.

Further, since the GaN layer 12 is interposed between the end surface of the $Al_xGa_{1-x}N$ layer 11 in the horizontal direction and the side surface of the trench gate 4, the distance between the growth interface of the epitaxial growth layer and the channel interface can be made larger.

FIG. 22 is a view showing a positional relation between the growth interface of the epitaxial growth layer and the channel interface. As shown in FIG. 22, an interface G1 between the $Al_xGa_{1-x}N$ layer 11 and the GaN layer 12 and an interface G2 between the GaN layer 12 and the GaN layer 10 correspond to the growth interface of the epitaxial growth layer, and a channel layer CHN is formed from the end surface of the GaN layer 12 toward the inside of the GaN layer 12, which are constituent part of the side surface of the trench gate 4.

Thus, since the channel layer CHN is largely far away from the interface G1, it is possible to increase the crystal quality of the channel layer CHN, and it becomes easier to reduce the amount of impurities to be mixed and increase the channel mobility. As a result, it becomes easier to reduce the ON resistance, as compared with the vertical trench MOSFET 100 of the first preferred embodiment.

Manufacturing Method

With reference to FIGS. 23 to 29, a method of manufacturing the vertical trench MOSFET 200 of the second preferred embodiment in accordance with the present invention will be described.

First, in a process step of FIG. 23, on the first main surface of the GaN substrate 8, the GaN layer 9, the GaN layer 10, and the $Al_xGa_{1-x}N$ layer 11 are sequentially layered. The thickness, the amount of impurities, the conductivity type, and the like of each layer are the same as those in the first preferred embodiment.

Figure 24:
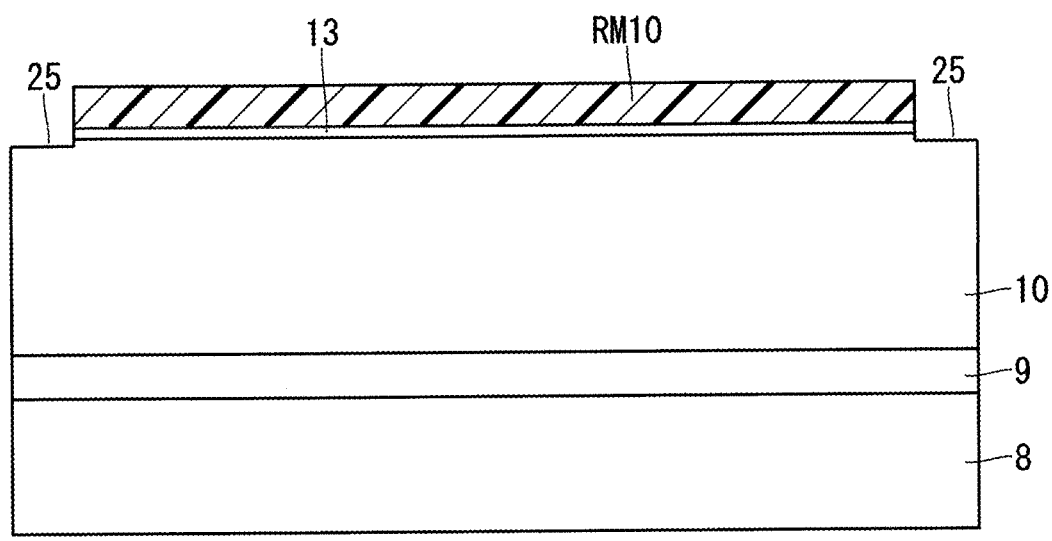
FIG. 24 is a cross section showing the method of manufacturing the semiconductor device of the second preferred embodiment in accordance with the present invention.

Next, in a process step of FIG. 24, a resist mask RM10 having an opening corresponding to a portion of the $Al_xGa_{1-x}N$ layer 11 which is to be removed is formed on the $Al_xGa_{1-x}N$ layer 11. With the resist mask RM10 used as an etching mask, the $Al_xGa_{1-x}N$ layer 11 is removed by dry etching and part of the GaN layer 10 is removed, to form a recess 25. Further, the depth of the recess 25 is not larger than 100 nm. After that, organic cleaning is performed on the GaN substrate 8 in a state where the recess 25 is formed, to remove the resist mask RM10.

Figure 25:
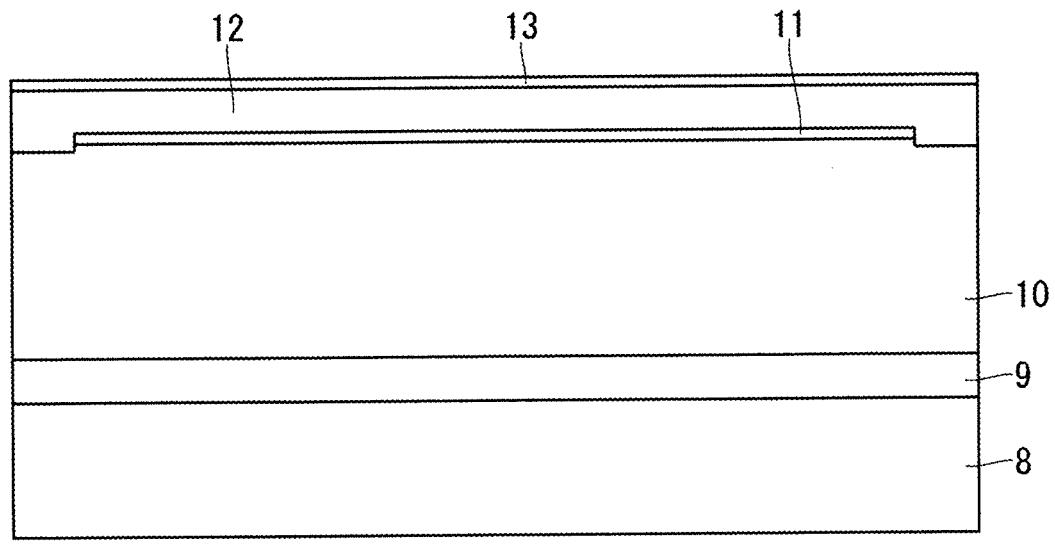
FIG. 25 is a cross section showing the method of manufacturing the semiconductor device of the second preferred embodiment in accordance with the present invention.

Next, the GaN substrate 8 after removing the resist mask RM10 is cleaned, and in a process step of FIG. 25, the GaN layer 12 and the GaN layer 13 are sequentially formed by epitaxial growth on the GaN layer 10 and the $Al_xGa_{1-x}N$ layer 11 by using the MOVPE method or the like.

Herein, since the GaN layer 12 serves as not only a prevention layer for punch-through but also a channel layer, it is preferable to reduce the Mg concentration as compared with the first preferred embodiment, and specifically the GaN layer 12 is so doped with Mg as to have a concentration of about $1\times10^{15}$ to $5\times10^{18}$ cm$^{-3}$. As described also in the first preferred embodiment, even when the Mg concentration of the GaN layer 12 is reduced, it is possible to keep the punch-through resistance by reducing the inter-trench distance.

Figure 26:
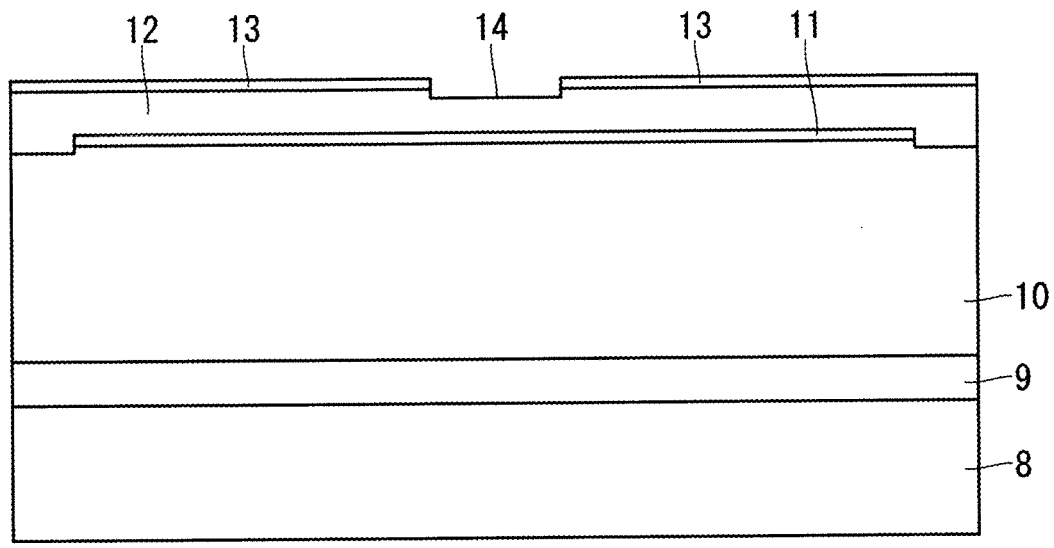
FIG. 26 is a cross section showing the method of manufacturing the semiconductor device of the second preferred embodiment in accordance with the present invention.

Next, a resist mask having an opening corresponding to a portion in which the body contact 14 is to be formed is formed on the GaN layer 13. After that, with the resist mask used as an etching mask, dry etching of the GaN layer 13 is performed by using the ICP-RIE device or the like. The condition for this dry etching is the same as that in the first preferred embodiment. After that, the resist mask is removed by organic cleaning or the like, and the body contact 14 shown in FIG. 26 is thereby obtained.

Figure 27:
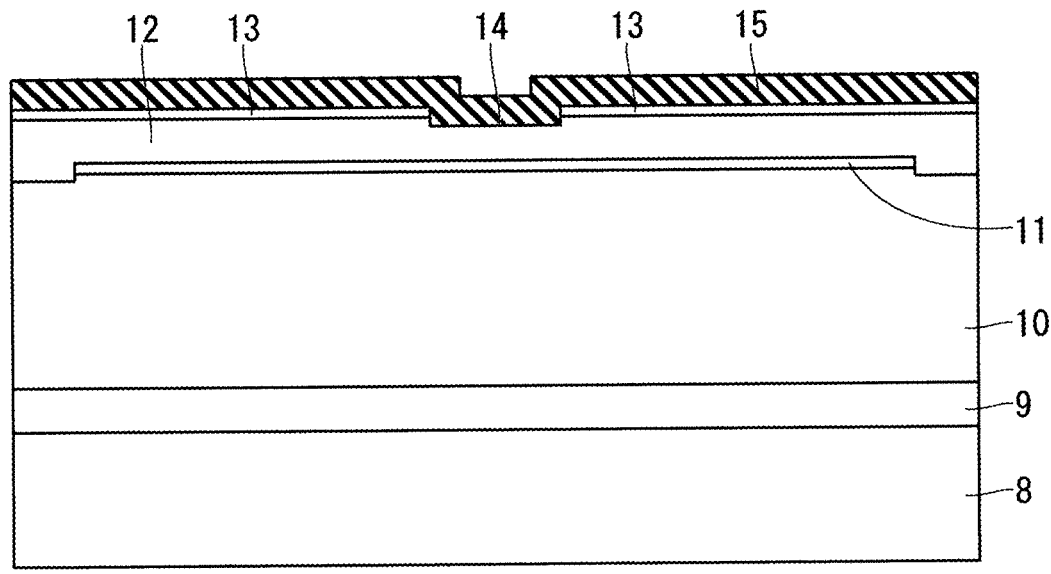
FIG. 27 is a cross section showing the method of manufacturing the semiconductor device of the second preferred embodiment in accordance with the present invention.

Next, in a process step of FIG. 27, the insulating film 15 is formed on the GaN layer 13 by using the sputtering method, the chemical vapor deposition (CVD) method, the coating method, or the like. The kind of the film and the film thickness are the same as those of the first preferred embodiment. After forming the insulating film 15, a resist mask (not shown) is formed on the insulating film 15 by photolithography. This resist mask has a pattern for processing the insulating film 15 as a hardmask to be used for formation of the trench gate 4. After that, with this resist mask used as an etching mask, the insulating film 15 is patterned by using, for example, the RIE device. The gas to be used for this etching and the etching condition are the same as those of the first preferred embodiment. Finally, the resist mask is removed by organic cleaning or the like.

Figure 28:
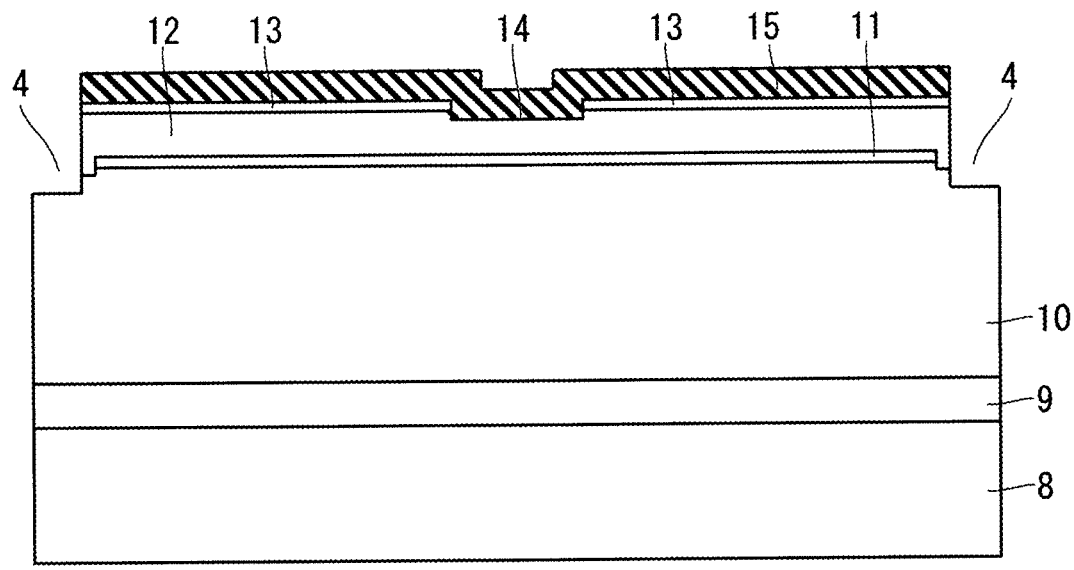
FIG. 28 is a cross section showing the method of manufacturing the semiconductor device of the second preferred embodiment in accordance with the present invention.

Next, in a process step of FIG. 28, with the patterned insulating film 15 used as a hardmask, the GaN layers 13, 12, and 10 are selectively removed by dry etching using the ICP-RIE device or the like, to thereby form the trench gate 4. The etching gas used for this dry etching is the same as that of the first preferred embodiment. The width of the trench gate 4 formed herein is set smaller than that of the recess 25. The GaN layer 12 thereby exists between the end surface of the $Al_xGa_{1-x}N$ layer 11 in the horizontal direction and the side surface of the trench gate 4, and the channel layer formed from the end surface of the GaN layer 12 toward the inside of the GaN layer 12 is directly connected to the GaN layer 10 serving as a drift layer in the conducting state of the transistor.

Further, when the width of the GaN layer 12 interposed between the end surface of the $Al_xGa_{1-x}N$ layer 11 in the horizontal direction and the side surface of the trench gate 4 is made too large, since the current spreading layer (CSL) formed by the two-dimensional electron gas (2DEG) generated in the interface between the $Al_xGa_{1-x}N$ layer 11 and the GaN layer 10 becomes short, it is desirable to suppress the width to one twentieth of the inter-trench distance.

Figure 29:
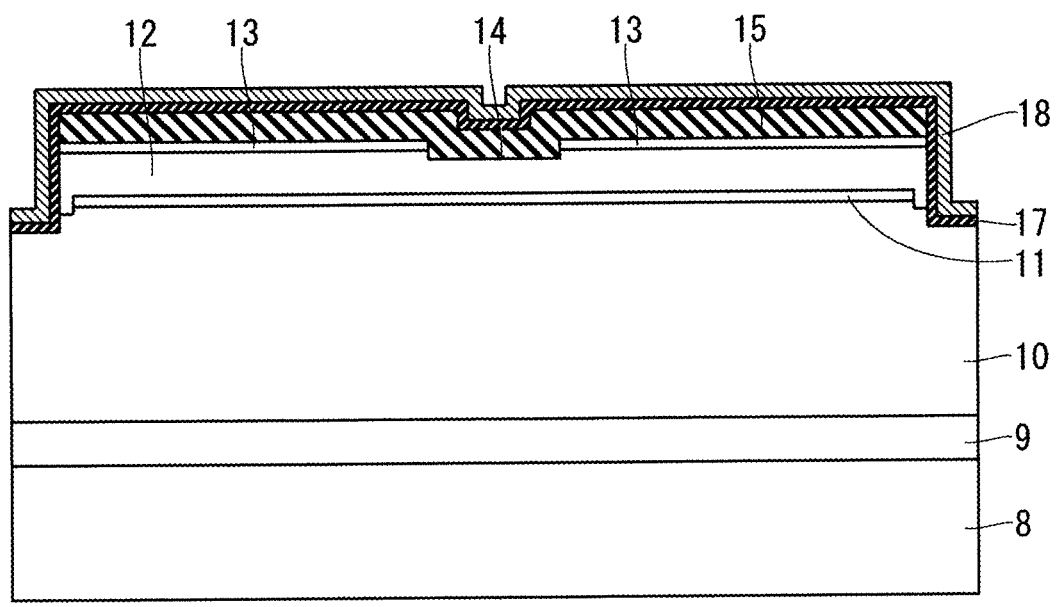
FIG. 29 is a cross section showing the method of manufacturing the semiconductor device of the second preferred embodiment in accordance with the present invention.

Next, the GaN substrate 8 is cleaned in the state where the trench gate 4 is formed, and in a process step of FIG. 29, the gate insulating film 17 is formed inside the trench gate 4 and on the insulating film 15. The method of forming the gate insulating film 17, the kind of the gate insulating film 17, and the film thickness thereof are the same as those of the first preferred embodiment.

After forming the gate insulating film 17, the gate electrode 18 is so formed to cover the gate insulating film 17. The method of forming the gate electrode 18, the material therefor, and the film thickness thereof are the same as those of the first preferred embodiment. Since the manufacturing method after this step is the same as that of the first preferred embodiment, description thereof will be omitted.

The Third Preferred Embodiment

Other than the first and second preferred embodiments in accordance with the present invention described above, various preferred embodiments may be adopted.

While the case where the GaN substrate 8 suitable for a vertical GaN semiconductor device is used as a free-standing substrate, for example, has been shown in the first and second preferred embodiments, a substrate in which a GaN layer is heteroepitaxially grown on a free-standing substrate whose material is different in the kind from GaN, such as Si, sapphire, silicon carbide (SiC), AlN, or the like may be used, instead of the GaN substrate 8, in terms of cost. Such a substrate is currently on the market, for example, as a GaN-on-Si substrate, GaN-on-sapphire substrate, a GaN-on-silicon carbide substrate, or the like Herein, it is defined that the free-standing substrate is a substrate which can be handled without the need of any support of other members. Since the free-standing substrate cannot be handled when the thickness thereof is too thin, it can be also defined that the free-standing substrate is a substrate having a thickness of about several hundreds μm.

In a case where a free-standing substrate of a different kind is used, the drain electrode 20 is formed on a second main surface of the free-standing substrate of a different kind by doping the free-standing substrate with an n-type impurity or by forming a via hole which reaches the GaN layer 9 from the second main surface of the free-standing substrate of a different kind.

Figure 30:
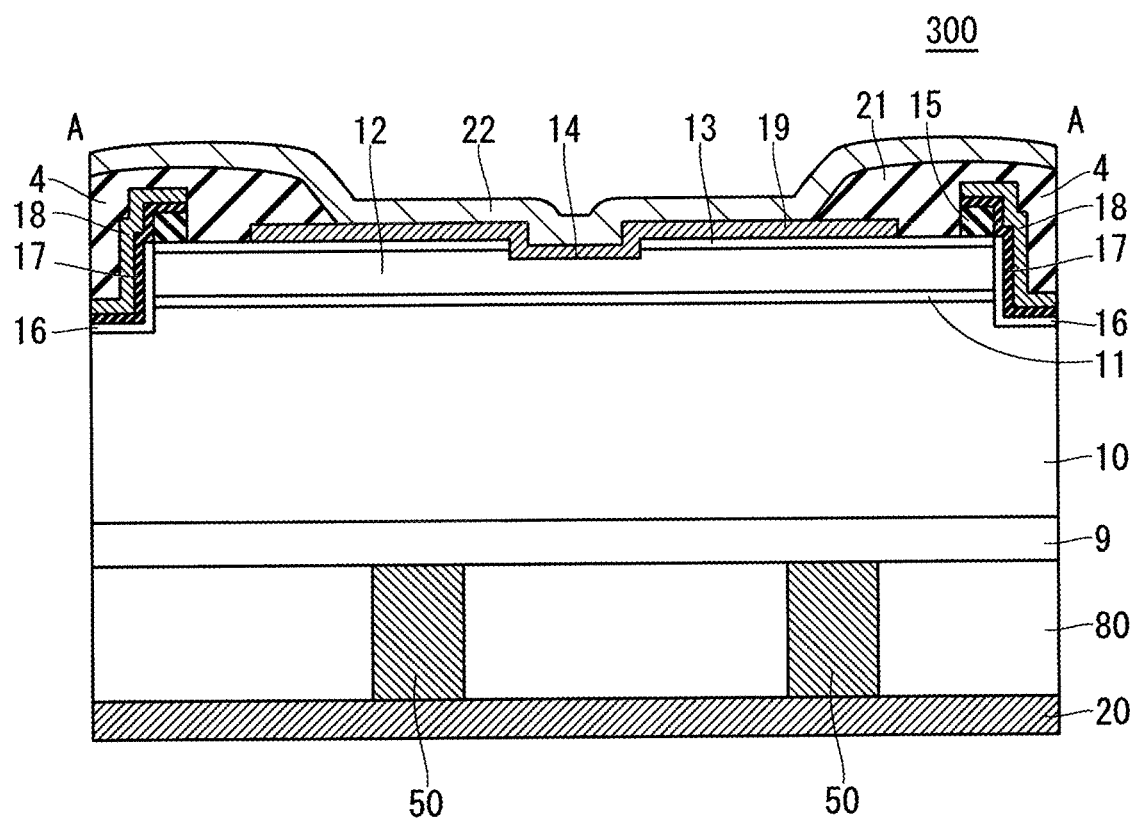
FIG. 30 is a cross section showing a source unit cell of a semiconductor device of a third preferred embodiment in accordance with the present invention.

One exemplary structure in the case where the latter method is adopted is shown in FIG. 30. In a vertical trench MOSFET 300 of FIG. 30, while the structure which is upper from the GaN layer 9 is the same as that of the vertical trench MOSFET 100 of the first preferred embodiment, the GaN layer 9 is formed on, for example, a first main surface of an AlN substrate 80. Then, inside the AlN substrate 80, a plurality of via holes 50 are formed, which penetrate the AlN substrate 80 from the first main surface toward a second main surface thereof, and on the second main surface of the AlN substrate 80, formed is the drain electrode 20.

A conductive film is embedded in each of the plurality of via holes 50, which electrically connects the n-type GaN layer 9 to the drain electrode 20. Such a method is effective since reduction in the resistance by doping of impurity is difficult in the AlN substrate 80. Further, the method is effective also in a case of using the GaN-on-sapphire substrate in which the free-standing substrate is an insulating material and in another case of using the GaN-on-Si substrate which needs a superlattice structure formed of AlN and AlGaN between the GaN layer and the free-standing substrate, due to a problem of lattice mismatch.

The Fourth Preferred Embodiment

Figure 31:
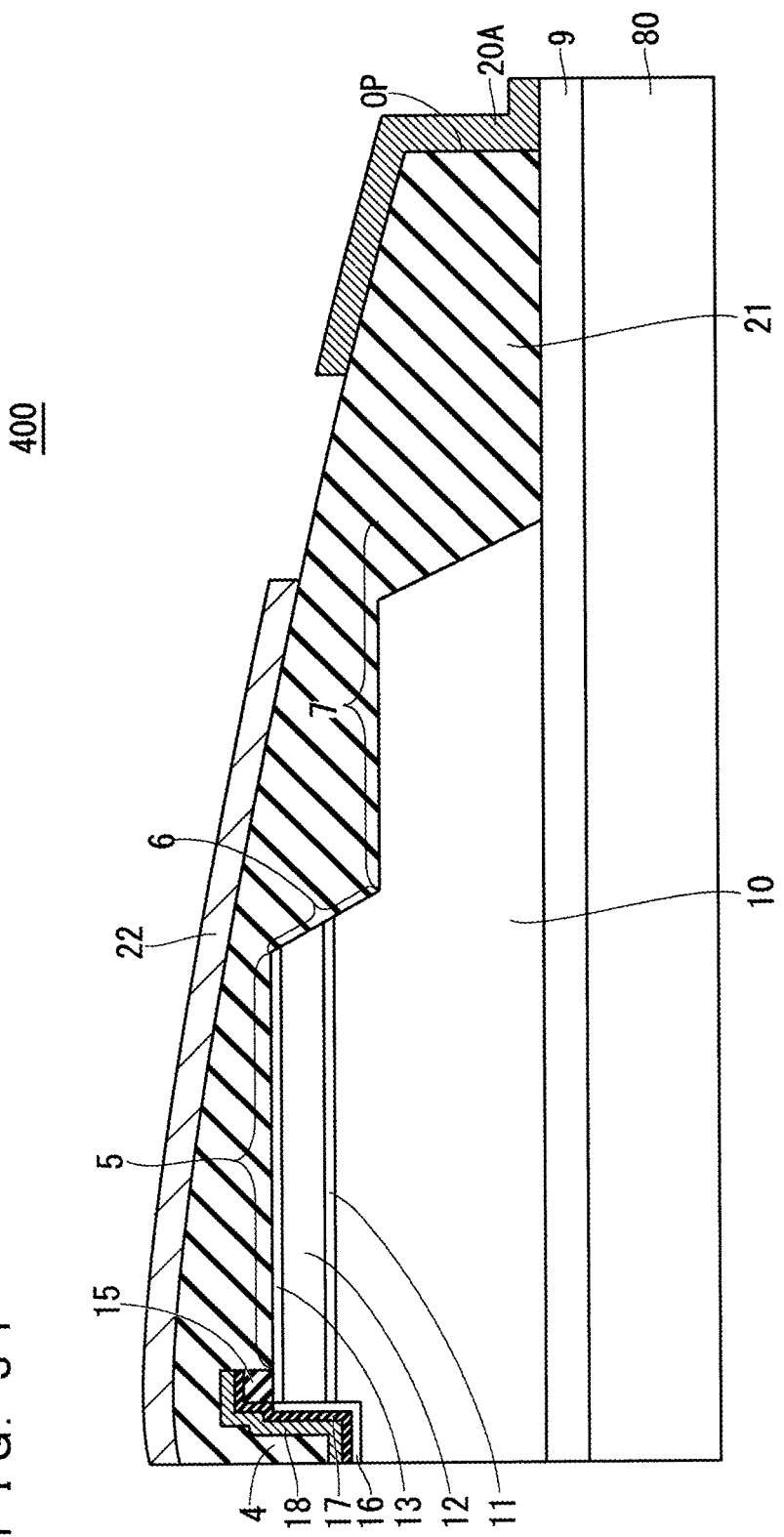
FIG. 31 is a cross section showing a source unit cell of a semiconductor device of a fourth preferred embodiment in accordance with the present invention.

Further, in the case of using the free-standing substrate of a different kind, such a structure as called a pseudo-vertical structure may be adopted as a method other than the above-described ones. FIG. 31 is a cross section showing a vertical trench MOSFET 400 as one exemplary pseudo-vertical structure. In FIG. 31, shown is a cross section of a termination cell which straightforwardly represents a characteristic feature of the pseudo-vertical structure.

As shown in FIG. 31, the GaN layer 9 formed on the first main surface of the AlN substrate 80 extends up to a substrate end of the AlN substrate 80 in the horizontal direction. Further, in order to reduce the sheet resistance, the n-type impurity concentration of the GaN layer 9 is about $1\times10^{18}$ to $1\times10^{20}$ cm$^{-3}$.

Then, the GaN layer 9 is exposed in a bottom portion of an opening OP which is so provided as to penetrate the insulating film 21 at the substrate end and electrically connected to a drain electrode 20A embedded in the opening OP. The drain electrode 20A extends up to an upper portion of an edge portion of the insulating film 21, and the source pad electrode 22 and the drain electrode 20A are present in the same plane. For this reason, though no drain electrode is provided on the second main surface of the AlN substrate 80, this structure is regarded as the pseudo-vertical structure since a main current of the vertical trench MOSFET 400 flows from the side of the source pad electrode 22 toward the GaN layer 9 in a longitudinal direction.

Further, except that no drain electrode is provided on the second main surface of the AlN substrate 80, the other structure of the vertical trench MOSFET 400 is the same as that of the vertical trench MOSFET 100 of the first preferred embodiment.

By adopting such a structure, the AlN substrate or the like in which it is hard to reduce a resistance by doping of impurity can be used. Further, it is possible to manufacture a semiconductor device by a simple process, as compared with the case where via holes are formed in the free-standing substrate.

As described above, by using a free-standing substrate which is a different kind from GaN as the supporting substrate, it is possible to achieve a vertical GaN semiconductor device which is cheaper in terms of cost.

While the first to fourth preferred embodiments have been described above with the vertical trench MOSFET taken as an example, a vertical trench IGBT (Insulated Gate Bipolar Transistor) can be achieved when a sixth GaN layer of the second conductivity type is provided on the second main surface of the GaN substrate 8. Further, a vertical trench IGBT can be achieved also when a p-type GaN substrate 8 is used.

While the invention has been shown and described in detail, the foregoing description is in all aspects illustrative and not restrictive. It is therefore understood that numerous modifications and variations can be devised without departing from the scope of the invention.

Further, in the present invention, the preferred embodiments may be freely combined, or may be changed or omitted as appropriate, without departing from the scope of the invention.

The invention claimed is:

1. A semiconductor device, comprising:
   a supporting substrate having a first main surface and a second main surface;
   a first GaN layer of a first conductivity type provided on the side of the first main surface of the supporting substrate;
   a second GaN layer of the first conductivity type provided on the first GaN layer;
   an AlxGa1-xN (0<x<1) layer provided on the second GaN layer;
   a third GaN layer of a second conductivity type provided on the AlxGa1-xN (0<x<1) layer;
   a fourth GaN layer of the first conductivity type provided on the third GaN layer;
   an insulating film covering at least a top of the fourth GaN layer;
   a trench gate reaching the inside of the second GaN layer from an upper surface of the fourth GaN layer;
   a gate electrode provided in the trench gate with a gate insulating film interposed therebetween;
   a first main electrode connected to the third GaN layer; and
   a second main electrode paired with the first main electrode,
   wherein the donor concentration of the third GaN layer is lower than that of the fourth GaN layer.

2. The semiconductor device according to claim 1, wherein
   the AlxGa1-xN (0<x<1) layer has a thickness of 5 to 40 nm, and
   the Al composition x is 0.15 to 0.35.

3. The semiconductor device according to claim 1, wherein
   the first main electrode is connected to the third GaN layer through a contact portion which penetrates the fourth GaN layer in a thickness direction to reach the inside of the third GaN layer.

4. The semiconductor device according to claim 1, wherein
   the gate insulating film is formed of a multilayer film including at least a $SiO_2$ film.

5. The semiconductor device according to claim 1, wherein
   the gate electrode includes at least a TiN film or a polycrystalline silicon film.

6. The semiconductor device according to claim 1, wherein
   the second GaN layer, the third GaN layer, the AlxGa1-xN (0<x<1) layer, and the fourth GaN layer form a mesa structure,
   a side surface portion of the mesa structure is inclined in a forward tapered shape and a bottom surface portion thereof continuous with the side surface portion is formed of the second GaN layer, and the insulating film covers the side surface portion and the bottom surface portion of the mesa structure.

7. The semiconductor device according to claim 6, wherein the vertical position of the bottom surface portion of the mesa structure from the supporting substrate is lower than a bottom surface of the trench gate.

8. The semiconductor device according to claim 6, wherein the insulating film includes a siloxane resin film containing silicon.

9. The semiconductor device according to claim 8, wherein the first main electrode is electrically connected to a pad electrode, the insulating film is so provided as to become thicker in a phased manner from the side surface portion toward the bottom surface portion of the mesa structure, and the pad electrode covers the side surface portion and the bottom surface portion with the insulating film interposed therebetween and has a termination portion on the bottom surface portion.

10. The semiconductor device according to claim 1, wherein the trench gate penetrates the fourth GaN layer, the third GaN layer, and the AlxGa1-xN (0<x<1) layer in a thickness direction to reach the inside of the second GaN layer, and a side surface thereof includes respective end surfaces of the fourth GaN layer, the third GaN layer, and the AlxGa1-xN (0<x<1) layer, the semiconductor device further comprising:

a fifth GaN layer of the second conductivity type provided in contact with at least a side surface of the trench gate, having an impurity concentration lower than that of the third GaN layer.

11. The semiconductor device according to claim 10, wherein the fifth GaN layer has a thickness of 5 to 10 nm.

12. The semiconductor device according to claim 10, wherein the fifth GaN layer is provided in contact with only the side surface of the trench gate.

13. The semiconductor device according to claim 1, wherein the trench gate penetrates the fourth GaN layer and the third GaN layer in a thickness direction to reach the inside of the second GaN layer, and a side surface thereof includes respective end surfaces of the fourth GaN layer and the third GaN layer, the third GaN layer is interposed between an end surface of the AlxGa1-xN (0<x<1) layer and a side surface of the trench gate, and the gate insulating film is provided in contact with an inner surface of the trench gate.

14. The semiconductor device according to claim 1, wherein the supporting substrate includes any one of a GaN substrate of the first conductivity type, a Si substrate, a sapphire substrate, and a silicon carbide substrate, and the second main electrode is disposed on the second main surface of the supporting substrate.

15. The semiconductor device according to claim 1, wherein the supporting substrate includes any one of an AlN substrate, a Si substrate, and a sapphire substrate, any one of the AlN substrate, the Si substrate, and the sapphire substrate has a plurality of via holes which penetrate any one of the AlN substrate, the Si substrate, and the sapphire substrate from the first main surface toward the second main surface, and a conductive film is embedded in each of the plurality of via holes, and the second main electrode is disposed on the second main surface of the supporting substrate and electrically connected to the first GaN layer through the conductive film.

16. The semiconductor device according to claim 1, wherein the supporting substrate includes any one of an AlN substrate, a Si substrate, and a sapphire substrate, the first GaN layer is so provided as to extend up to a substrate end of any one of the AlN substrate, the Si substrate, and the sapphire substrate, the insulating film covers the substrate end and at the substrate end, the first GaN layer is exposed in a bottom portion of an opening which is so provided as to penetrate the insulating film, and the second main electrode is embedded in the opening to be in contact with the first GaN layer and so provided as to extend onto an upper portion of the insulating film.

17. The semiconductor device according to claim 1, wherein the third GaN layer contains magnesium (Mg) as an impurity of the second conductivity type, the concentration of Mg is not higher than $1 \times 10^{17}$ cm$^{-3}$, and an inter-trench distance which defines a length of the third GaN layer in a horizontal direction is not larger than 100 nm.

18. The semiconductor device according to claim 1, wherein the gate electrode is electrically connected to a gate pad electrode in a gate cell, the semiconductor device further comprising:

a protection electrode formed of gold (Au) and provided between the gate electrode and the gate pad electrode.

19. The semiconductor device according to claim 1, wherein the AlxGa1-xN (0<x<1) layer has a bottom surface whose vertical position from the supporting substrate is even with or higher than a bottom surface of the gate electrode.

* * * * *